United States Patent
Ruhl et al.

(10) Patent No.: US 9,627,196 B2
(45) Date of Patent: Apr. 18, 2017

(54) METHOD FOR PROCESSING A CARRIER

(71) Applicant: Infineon Technologies AG, Neubiberg (DE)

(72) Inventors: Guenther Ruhl, Regensburg (DE); Klemens Pruegl, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 134 days.

(21) Appl. No.: 14/511,199

(22) Filed: Oct. 10, 2014

(65) Prior Publication Data

US 2016/0104640 A1 Apr. 14, 2016

(51) Int. Cl.
  *H01L 21/44* (2006.01)
  *H01L 29/16* (2006.01)
  *H01L 21/02* (2006.01)
  *C01B 31/04* (2006.01)

(52) U.S. Cl.
  CPC .... *H01L 21/02527* (2013.01); *C01B 31/0453* (2013.01); *H01L 21/0237* (2013.01); *H01L 21/02488* (2013.01); *H01L 21/02664* (2013.01); *H01L 21/02667* (2013.01); *H01L 21/02614* (2013.01); *H01L 21/02631* (2013.01); *H01L 29/1606* (2013.01)

(58) Field of Classification Search
  CPC ........... H01L 29/1606; H01L 21/02502; H01L 21/02527
  USPC ........................................................ 438/653
  See application file for complete search history.

(56) References Cited

U.S. PATENT DOCUMENTS

| | | | | |
|---|---|---|---|---|
| 5,457,069 A | * | 10/1995 | Chen | H01L 21/28518 257/E21.165 |
| 8,927,415 B2 | * | 1/2015 | Niyogi | C23C 14/042 438/627 |
| 2012/0282446 A1 | * | 11/2012 | Jo | C01B 31/04 428/216 |
| 2014/0106561 A1 | * | 4/2014 | Niyogi | C23C 14/042 438/643 |
| 2014/0205763 A1 | * | 7/2014 | Lu | C01B 31/0446 427/530 |
| 2014/0374906 A1 | * | 12/2014 | Ruhl | H01L 21/7685 257/751 |
| 2015/0069329 A1 | * | 3/2015 | Jeon | B81C 1/00087 257/29 |

OTHER PUBLICATIONS

A. K. Geim, et al., Graphene : Status and Prospects, Science 324, 1530 (Jun. 2009), pp. 1530-1534.
(Continued)

*Primary Examiner* — Telly Green
(74) *Attorney, Agent, or Firm* — Viering, Jentschura & Partner mbB

(57) ABSTRACT

According to various embodiments, a method for processing a carrier may include: co-depositing at least one metal from a first source and carbon from a second source over a surface of the carrier to form a first layer; forming a second layer over the first layer, the second layer including a diffusion barrier material, wherein the solubility of carbon in the diffusion barrier material is less than in the at least one metal; and forming a graphene layer at the surface of the carrier from the first layer by a temperature treatment.

20 Claims, 20 Drawing Sheets

(56) References Cited

OTHER PUBLICATIONS

Keun Soo Kim, et al., "Large-scale pattern growth of graphene films for stretchable transparent electrodes", Nature vol. 457 Feb. 2009, pp. 706-710.
Sukang Bae, et al., "Roll-to-roll production of 30-inch graphene films for transparent electrodes", Nature Nanotechnology vol. 5 Aug. 2010, pp. 574-578.
G. Lippert, et al., "Molecular beam epitaxy of graphene on mica", Physica Status Solidi B, No. 12 (2012), pp. 2507-2510.
Toshiaki Kato, et al., "Diret Growth of Doping-Density-Controlled Hexagonal Graphene on SiO2 Substrate by Rapid-Heating Plasma CVD", www.acsnano.org (Sep. 2012).

* cited by examiner

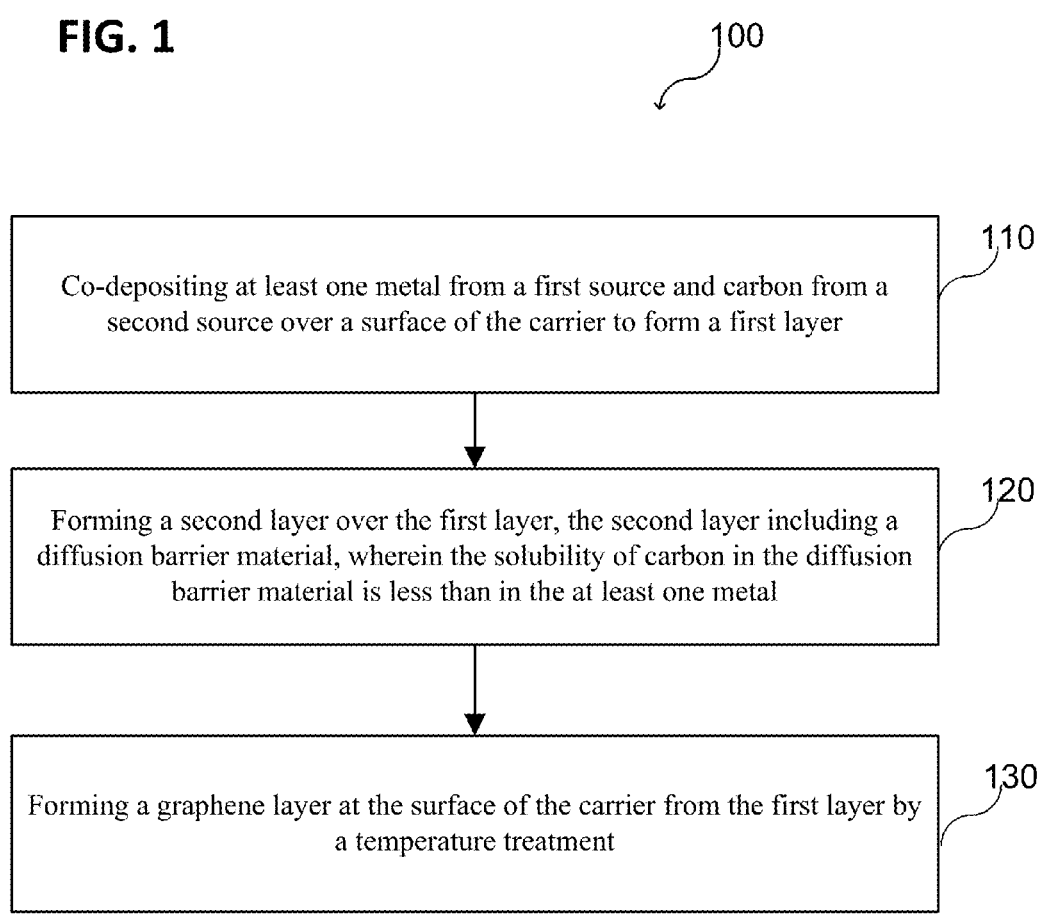

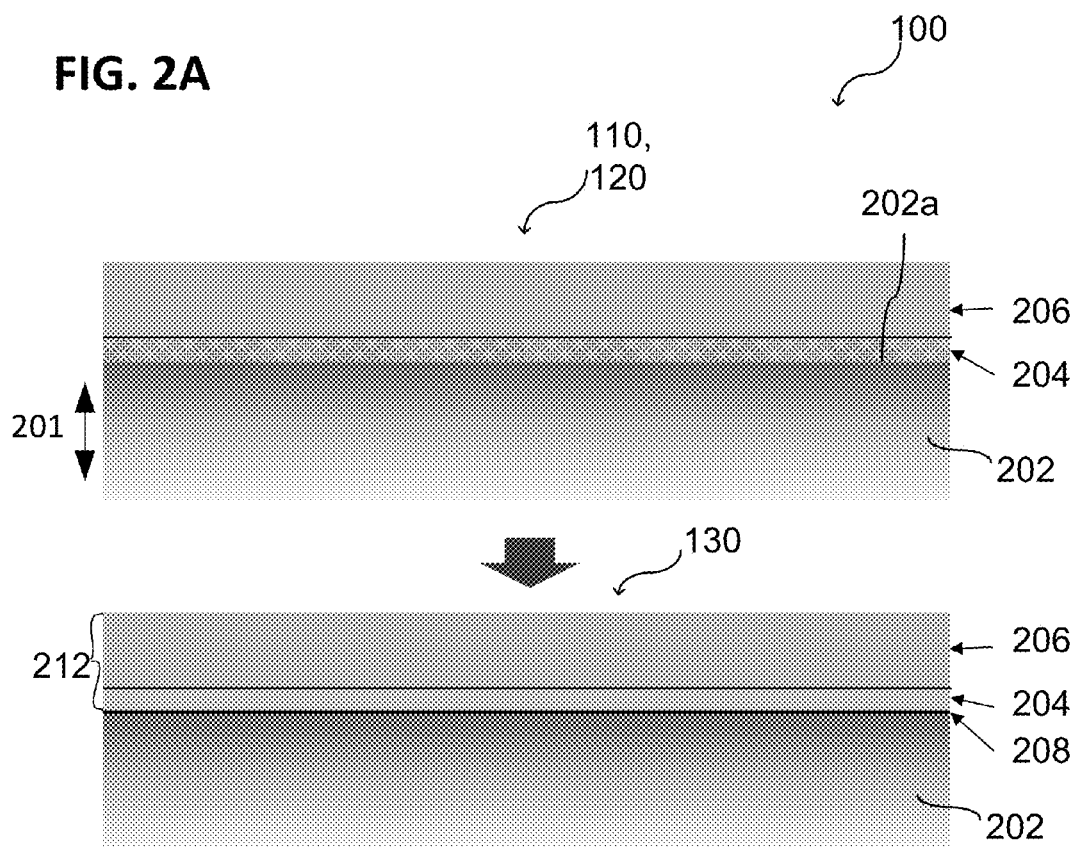

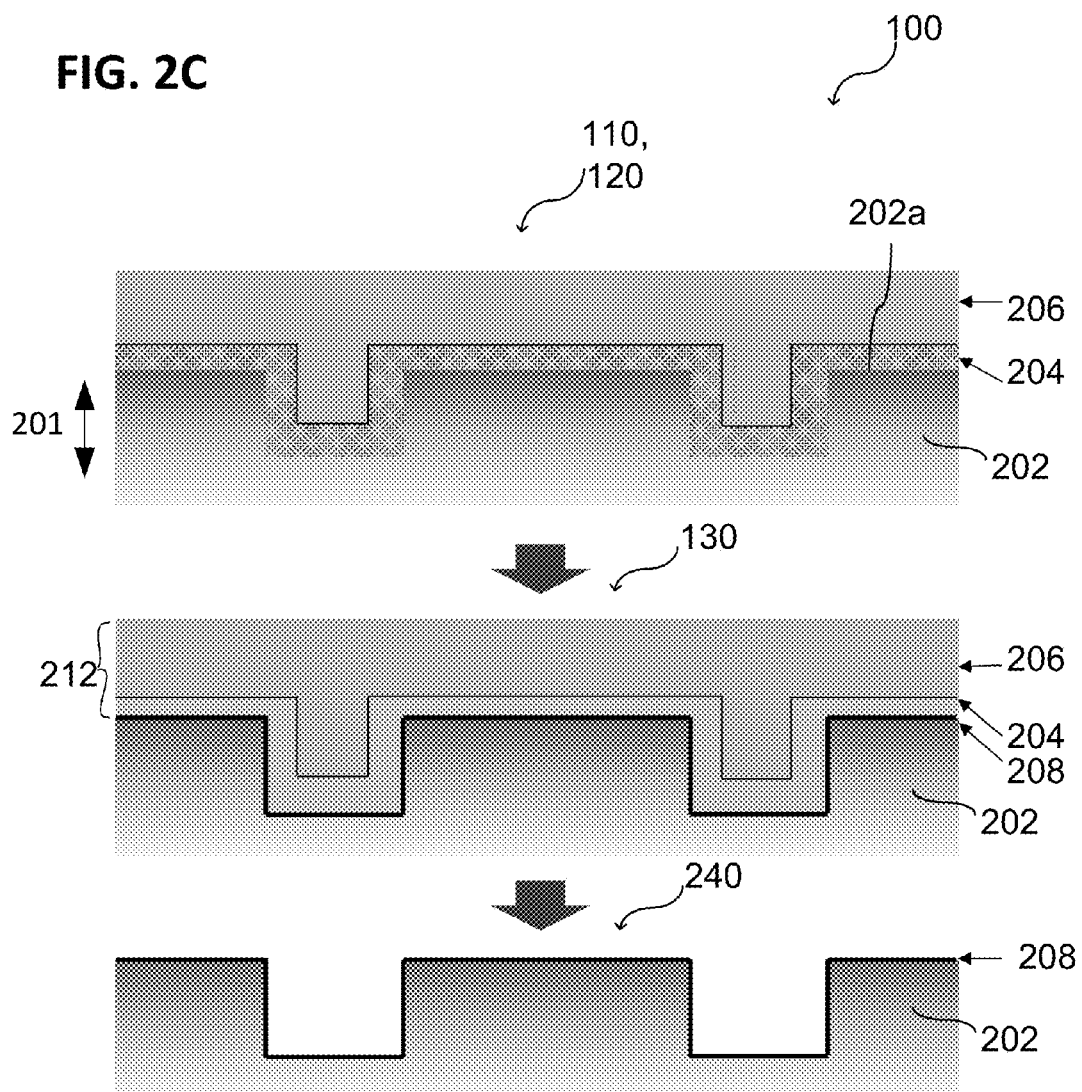

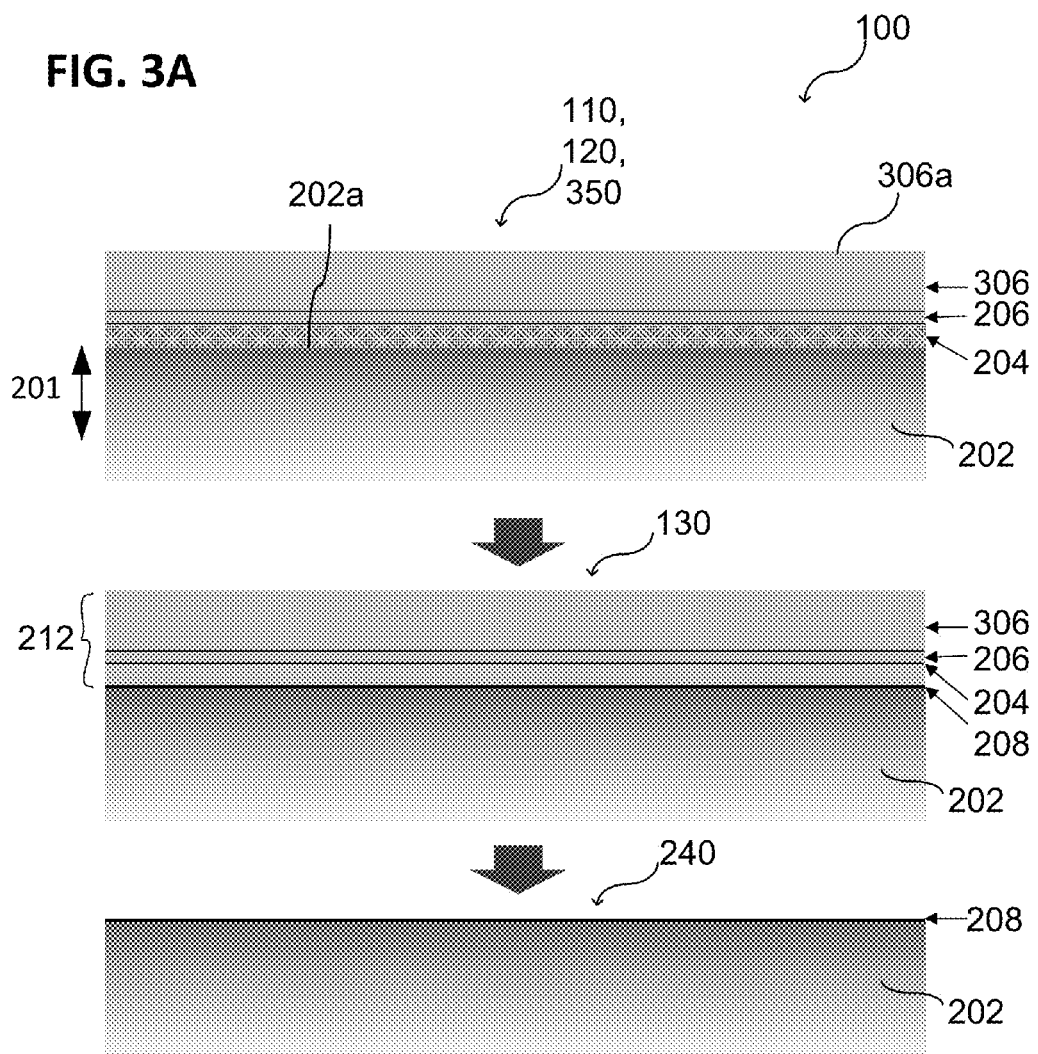

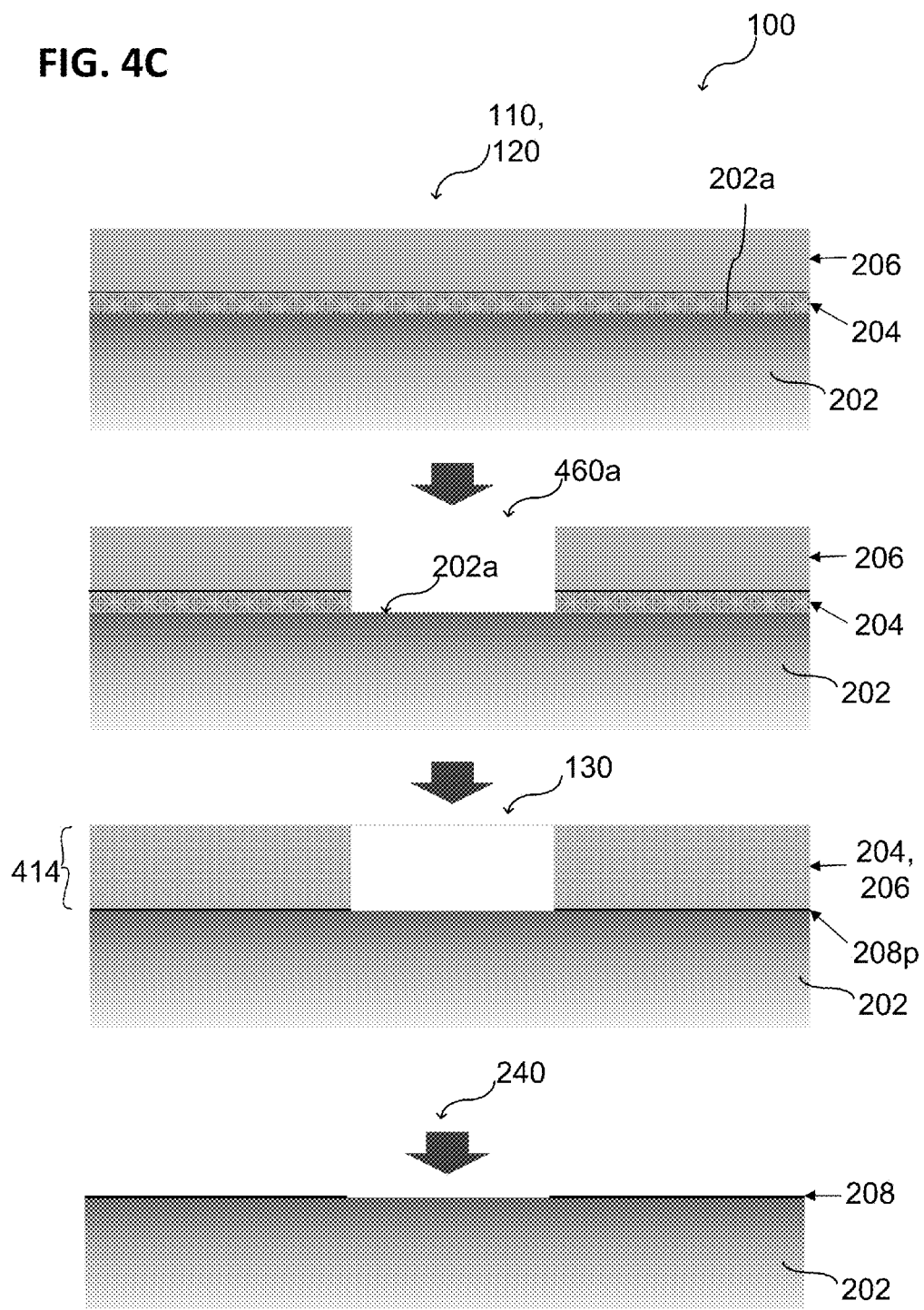

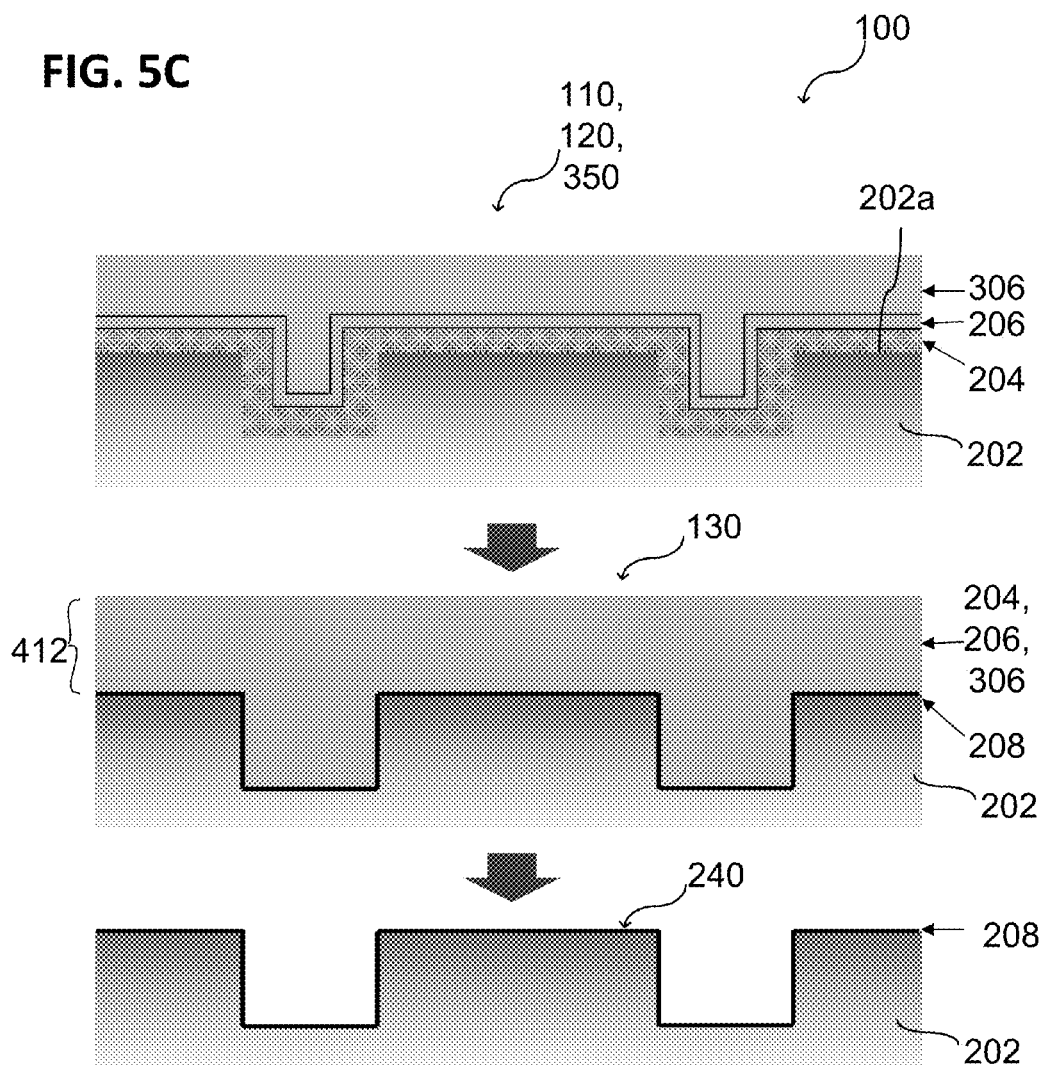

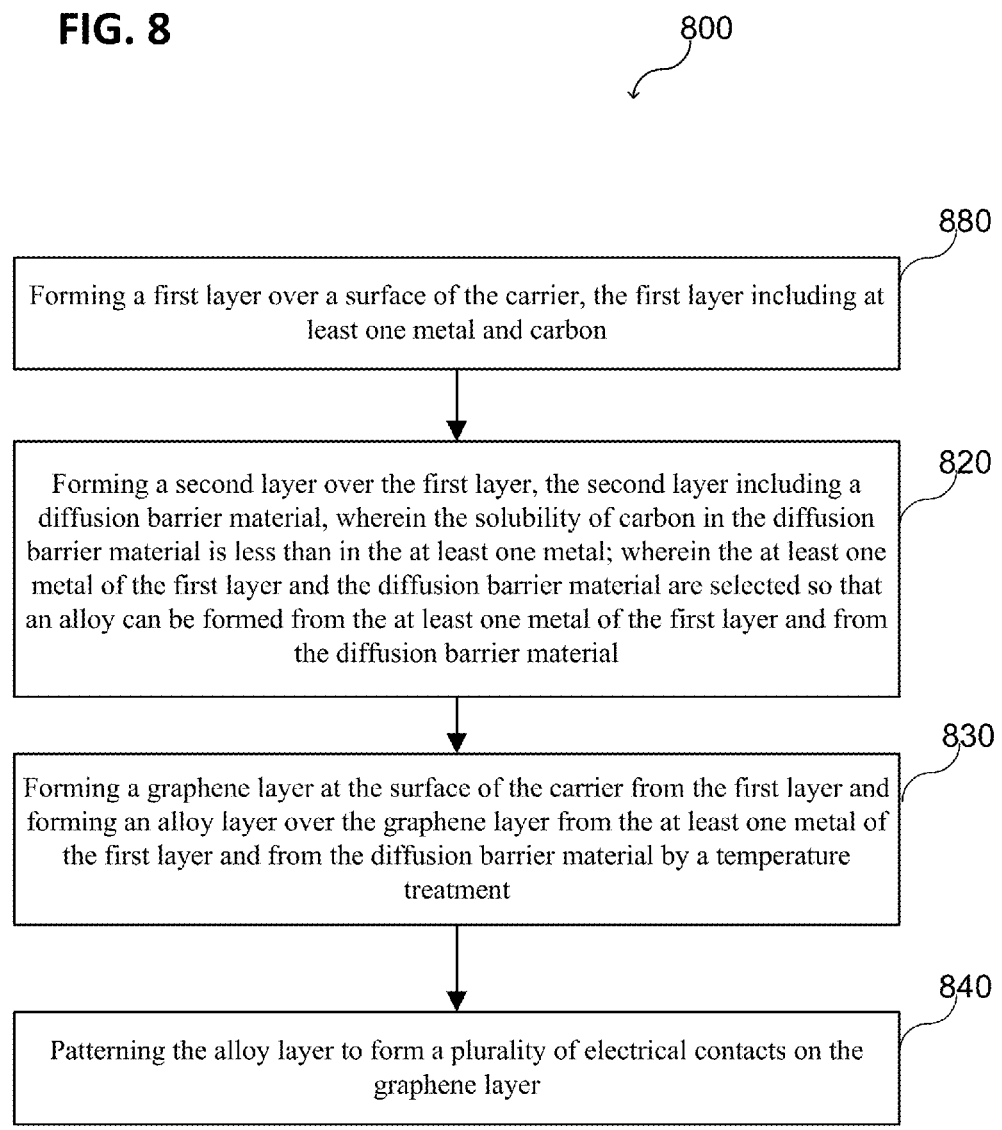

METHOD FOR PROCESSING A CARRIER

TECHNICAL FIELD

Various embodiments generally relate to a method for processing a carrier.

BACKGROUND

In general, forming a very thin layer of a material, e.g. with a thickness in the nanometer range or with a thickness even smaller than one nanometer, may be very challenging using typical processes of semiconductor industry. However, so-called two-dimensional materials may be highly attractive for electronic devices and integrated circuit technologies. Graphene for example, including a layer of carbon atoms in a hexagonal arrangement, may have superior electronic properties enabling, for example, the manufacturing of a transistor having an increased response and/or switching behavior. Further, an ultrathin layer of a material may have enhanced properties compared to the corresponding bulk material. Therefore, two-dimensional materials could be important for microelectronics, e.g. for developing various types of sensors, transistors, and the like, wherein the challenging task may be incorporating these two-dimensional materials into a microchip for emulating the common silicon technology.

SUMMARY

According to various embodiments, a method for processing a carrier may include: co-depositing at least one metal from a first source and carbon from a second source over a surface of the carrier to form a first layer; forming a second layer over the first layer, the second layer including a diffusion barrier material, wherein the solubility of carbon in the diffusion bather material is less than in the at least one metal; and forming a graphene layer at the surface of the carrier from the first layer by a temperature treatment.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a schematic flow diagram of a method for processing a carrier according to various embodiments;

FIGS. 2A to 2C show respectively a carrier at various stages during processing in a schematic cross sectional view or side view according to various embodiments;

FIGS. 3A and 3B show respectively a carrier at various stages during processing in a schematic cross sectional view or side view according to various embodiments;

FIGS. 4A to 4F show respectively a carrier at various stages during processing in a schematic cross sectional view or side view according to various embodiments;

FIGS. 5A to 5C show respectively a carrier at various stages during processing in a schematic cross sectional view or side view according to various embodiments;

FIG. 8 shows a schematic flow diagram of a method for processing a carrier according to various embodiments.

DESCRIPTION

Figure 2B:
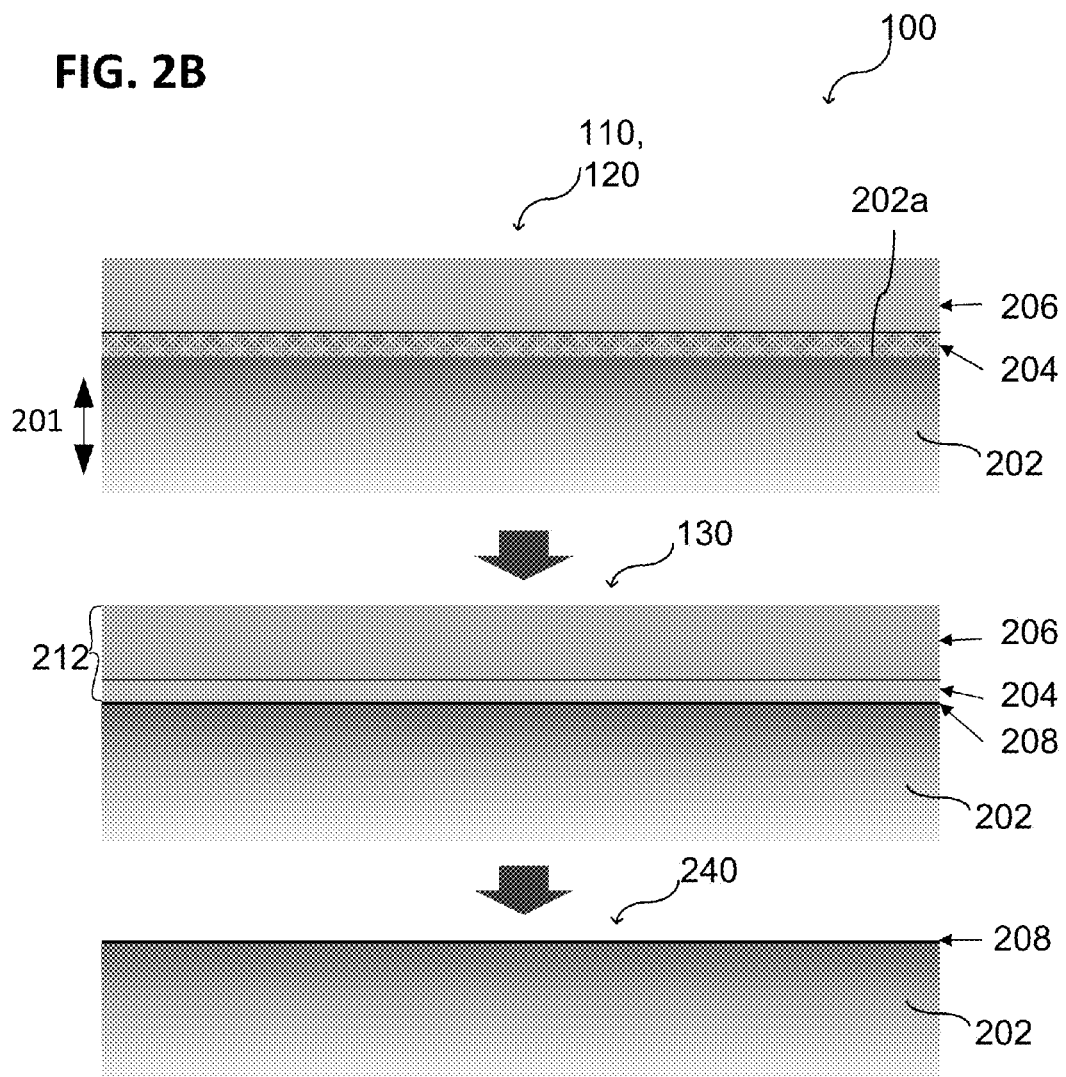

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "lateral" used with regards to the "lateral" extension of a structure (or of a structure element) provided at least one of on or in a carrier (e.g. a substrate, a wafer, or a semiconductor work piece) or "laterally" next to, may be used herein to mean an extension or a positional relationship along a surface of the carrier. That means that a surface of a carrier (e.g. a surface of a substrate, a surface of a wafer, or a surface of a semiconductor work piece) may serve as reference, commonly referred to as the main processing surface. Further, the term "width" used with regards to a "width" of a structure (or of a structure element) may be used herein to mean the lateral extension of a structure. Further, the term "height" used with regards to a height of a structure (or of a structure element), may be used herein to mean an extension of a structure along a direction perpendicular to the surface of a carrier (e.g. perpendicular to the main processing surface of a carrier). The term "thickness" used with regards to a "thickness" of a layer may be used herein to mean the spatial extension of the layer perpendicular to the surface of the support (the material or material structure) on which the layer is deposited. If a surface of the support is parallel to the surface of the carrier (e.g. parallel to the main processing surface) the "thickness" of the layer deposited on the surface of the support may be the same as the height of the layer. Further, a "vertical" structure may be referred to as a structure extending in a direction perpendicular to the lateral direction (e.g. perpendicular to the main processing surface of a carrier) and a "vertical" extension may be referred to as an extension along a direction perpendicular to the lateral direction (e.g. an extension perpendicular to the main processing surface of a carrier).

According to various embodiments, a carrier (e.g. a substrate, a wafer, or a work piece) may be made of or may include semiconductor materials of various types, including, for example, silicon, germanium, Group III to V or other types, including polymers, for example, although in another embodiment, other suitable materials can also be used. In an embodiment, the carrier is made of silicon (doped or undoped), in an alternative embodiment, the carrier is a silicon on insulator (SOI) wafer. As an alternative, any other suitable semiconductor materials can be used for the carrier, for example semiconductor compound material such as gallium arsenide (GaAs), indium phosphide (InP), but also any suitable ternary semiconductor compound material or quaternary semiconductor compound material such as indium gallium arsenide (InGaAs). According to various embodiments, the carrier may be a thin or an ultrathin substrate or wafer, e.g. with a thickness in the range from about several micrometers to about several tens of micrometers, e.g. in the range from about 5 µm to about 50 µm, e.g. with a thickness less than about 100 µm or less than about 50 µm. According to various embodiments, a carrier may include SiC (silicon carbide) or may be a silicon carbide carrier, a silicon carbide substrate, a silicon carbide wafer, or a silicon carbide work piece. According to various embodiments, a carrier may include $SiO_2$ (silicon oxide) or may be a silicon oxide carrier, a silicon oxide substrate, a silicon oxide wafer, or a silicon oxide work piece. Further, a carrier may include an electrically isolating material (in other words a dielectric material or an electrically insulating material) at a surface of the carrier or the carrier may consist of an electrically isolating material so that an electrically conductive layer, e.g. a graphene layer, may be formed and functionalized at the surface of the carrier.

In general, the physical and chemical properties of a material may not be defined exclusively by its crystal structure and chemical composition. Since the physical properties, for example the electronic properties (e.g. the band structure), of a surface of a material may differ from the physical properties of the bulk material, there may be a difference regarding the physical properties of a layer or region, if at least one spatial extension of the layer or region may be reduced in the nanometer range or even sub-nanometer range. In this case, the surface properties of the respective material forming the layer or region may dominate the characteristics (e.g. physical and chemical properties) of the layer or the region. In the limiting case, at least one dimension of a layer or region may have the spatial extension of several angstroms, which may be the spatial extension of exactly one monolayer of atoms of the respective material. A monolayer may be a layer having a lateral extension and a layer thickness (or height) perpendicular to the lateral extension, the layer including a plurality of atoms (or molecules), wherein the layer has a thickness (or height) of one single atom (or molecule). In other words, a monolayer of a material may not have equal atoms (or molecules) being arranged above each other (along the thickness or height direction).

According to various embodiments, there may be several different materials intrinsically forming monolayers, so-called self-assembled monolayers, which may be referred to as two-dimensional materials, or more precisely as structural two-dimensional materials. Further, a typical representative of such a structural two-dimensional material may be graphene, consisting of a hexagonal two-dimensional arrangement of carbon atoms, a so-called honey-comb structure. According to various embodiments, graphene may be also referred to as a graphene sheet or a graphene layer. A further representative of a structural two-dimensional material may be hydrogenated graphene (graphane), or partially hydrogenated graphene. In pure graphene sheets, the structural arrangement and the bindings of the carbon atoms may be described using hybridization (hybrid atomic orbitals), wherein in this case the carbon atoms are $sp^2$-hybrids, which means that a covalent bonding of the carbon atoms forms a hexagonal two-dimensional layer, a hexagonal monolayer. In hydrogenated graphene or graphane, the carbon atoms may be $sp^3$-hybrids or a mixture of $sp^2$-hybrids and $sp^3$-hybrids, wherein the carbon atoms being $sp^3$-hybrids are connected to a hydrogen atom, forming a sheet like (two-dimensional) structure.

A structural two-dimensional material, as referred to herein, may be a layer having covalent bonding along two spatial directions forming a sheet structure or a two-dimensional structure, e.g. self-assembled, wherein the structural two-dimensional material may not have a covalent bonding to other atoms outside the sheet structure. A structural two-dimensional material, as referred to herein, may be a layer consisting of a monolayer of a material. A structural two-dimensional material, as referred to herein, may be a layer consisting of a bilayer of a material. According to various embodiments, a graphene layer may include carbon in a two-dimensional structure, e.g. in a hexagonally arranged lattice.

Typical three-dimensional materials, e.g. metal bulk material, may have different physical and chemical properties, depending on the lateral extension of the material, e.g. a monolayer or an ultra-thin layer of a material may have different properties than a bulk of the same material. A monolayer or an ultra-thin layer of a three-dimensional material may have different properties than a thicker layer of the material, since the volume to surface ratio is changing. Therefore the properties of a thin layer of a material may aspire to the bulk properties of the material for increasing layer thickness.

In contrast, a layer including a structural two-dimensional material, e.g. graphene, graphane, silicene, germanene, may retain its physical and chemical properties independently from the layer thickness, e.g. a monolayer of a structural two-dimensional material may have substantially the same properties as a plurality of monolayers arranged above each other, since the individual layers may not be substantially coupled to each other, e.g. since there may be no covalent, ionic, and/or metallic bonding between the individual layers of a structural two-dimensional material. According to various embodiments, a plurality of graphene layers or sheets stacked above each other may be weakly coupled with each other (e.g. via van der Waals interaction).

A conformal layer, as described herein, may exhibit only small thickness variations along the interface with another body, e.g. the layer may exhibit only small thickness variations along edges, steps or other elements of the morphology of the interface. A monolayer of a material covering a surface of an underlying body or base structure (e.g. in direct contact) may be regarded as a conformal layer. A monolayer or a bilayer of a structural two-dimensional material covering a surface of an underlying body or base structure (e.g. in direct contact) may be regarded as a conformal layer. According to various embodiments, a layer stack including a plurality of conformal layers may be deposited over a surface of a carrier, wherein the layer stack is annealed subsequently to form a conformal graphene layer at the surface of the carrier.

As described herein, a structural two-dimensional material may exhibit unique physical and/or chemical properties. Graphene, for example, may be a semiconductor (e.g. a zero-gap semiconductor), or a semi-metal having a very high charge carrier mobility (e.g. in the range from about 40,000 to about 200,000 $cm^2$/Vs on an electrically insulating substrate). Further, graphene may have other unique properties (electrical, mechanical, magnetic, thermal, optical, and the like), making graphene interesting for electronic industry (e.g. for the use in sensors (gas sensors, magnetic sensors), as electrodes, in transistors, as quantum dots, and the like). However, using graphene, as well as other promising structural two-dimensional materials, may include one or more graphene layers (e.g. a graphene monolayer, e.g. a graphene bilayer, e.g. a graphene multilayer) disposed on an electrically insulating substrate, e.g. on silicon dioxide.

According to various embodiments, a method for processing a carrier may be provided, which may be used for forming a structural two-dimensional layer on an arbitrary carrier, e.g. on a dielectric substrate. The method for processing a carrier may be used for forming a monolayer of a material, e.g. a graphene monolayer or a graphene sheet. The method for processing a carrier may be used for forming a bilayer of a material, e.g. a graphene bilayer. The method for processing a carrier may be used for forming a layer stack including a plurality of graphene sheets. The method for processing a carrier may be used for forming a layer including a structural two-dimensional material, e.g. graphene. The method for processing a carrier, as described herein, may enable a simple, controllable, reproducible, stable, cost efficient manufacturing of a layer including a structural two-dimensional material (e.g. of one or more graphene layers or graphene sheets) on an electrically insulating substrate (or on an arbitrary substrate, since the process may not be limited to a specific type of substrates). Further, the method for processing a carrier, as described herein, may allow the processing of large areas (e.g. greater than 1 mm$^2$) and/or processing of structured (patterned) substrates. In other words, the method for processing a carrier, as described herein, may allow the manufacturing of a layer including a structural two-dimensional material having a large lateral extension and/or covering a large area of a carrier. Further, the method for processing a carrier, as described herein, may reduce or may prevent the formation of foldings and/or wrinkles in a structural two-dimensional material formed over a carrier. Further, the method for processing a carrier, as described herein, may enable a fast manufacturing process being easily adapted or used for various electrically insulating substrates and/or electrically conductive substrates. Therefore, the method for processing a carrier, as described herein, may circumvent and/or solve actual problems in manufacturing graphene monolayers, graphene bilayers, and/or graphene multilayers. Further, the method for processing a carrier, as described herein, may be adapted to manufacture other structural two-dimensional layers, e.g. silicene layers, germanene layers, and the like.

Manufacturing methods typically used for providing graphene on electrically insulating substrates may include segregation of carbon from a metal (e.g. nickel), wherein carbon may be solved in a metal layer on a substrate at high temperatures, such that the metal can solve carbon, and wherein the carbon segregates while the metal layer is cooled down. Since the carbon may be provided in common processes by using, for example, carbon ion implantation or decomposing carbon containing materials at high temperatures, the carbon may be substantially introduced at the surface of the metal (away from the interface of the metal to the substrate), which may result in a preferential formation (segregation) of graphene at the surface of the metal layer and not at the interface to the substrate. This may cause, for example, the problem that it may be difficult to expose the graphene layer using common processes, e.g. removing the metal via etching, since the graphene formation at the surface of the metal layer may be accompanied by the formation of one or more carbide-phases below the graphene. Therefore, etching the metal layer in a typically used processes, e.g. to expose the graphene layer at the interface to the substrate, may be difficult and may include removing the upper graphene layer from the surface of the metal layer using additional complex etch processes (e.g. using plasma etching in oxygen-containing atmosphere or thermal etching in oxygen-containing atmosphere at high temperatures (greater than 500° C.)). Further, removing the occurring one or more carbide-phases on or within the metal layer may be difficult and uniformly removing the occurring one or more carbide-phases may be difficult and/or even impossible, which may cause problems in removing the metal layer and exposing the graphene layer which is formed at the surface of the substrate.

According to various embodiments, the method for processing a carrier, as described herein, may further prevent the formation of carbide-phases and/or graphene segregation on top of the metal layer, resulting in an enhanced deposition process for graphene layers (monolayers, bilayers, or multilayers).

Various embodiments illustratively provide a method for forming a pure graphene layer (or graphene sheet) on an electrically insulating substrate, wherein the electrically insulating substrate may also be a patterned substrate having an electrically insulating surface (or surface layer). In other words, a graphene layer (monolayer, bilayer, trilayer, and the like) may be formed on an electrically insulating substrate, such that the graphene layer may not have a contact to a metal or to an electrically conductive material. Therefore, the electronic properties of the graphene layer, for example, may not be influenced by an adjacent metal or an adjacent electrically conductive material. According to various embodiments, the method for processing a carrier, as described herein, may allow the controlled formation of a graphene layer on a surface of a dielectric substrate via segregation of carbon from a metal layer being arranged over the substrate, avoiding formation of carbide-phases and unwanted carbon segregation on the surface of the metal layer.

Further, according to various embodiments, a method for forming a pure graphene layer (or graphene sheet) on an electrically insulating substrate, may be provided, which may allow the controlled formation of single layer graphene and/or multilayer graphene via controlling at least one of the hydrogen content of the carbon, the hydrogen content of the catalytic metal and the hydrogen content of the annealing atmosphere for forming the graphene layer.

According to various embodiments, a method for forming graphene on an arbitrary substrate may be provided by means of asymmetrical segregation of carbon from a metal layer. Thereby, a formation of graphene and/or metal carbide phases on the surface of the metal layer may be prevented or substantially reduced, wherein graphene and/or metal carbide phases on the surface of the metal layer could affect an etching of the metal layer.

A metal, as referred to herein, may also include or may be also understood as metalloid or metal alloy. Various metals (e.g. nickel, cobalt, tungsten, iridium, platinum) may form a solid solution (also referred to as solid-state solution) with carbon. Illustratively, a metal may act as a solvent for carbon (or other small atoms, as for example, nitrogen), wherein carbon is the solute. In this case the metal may not chemically react with the carbon (or may not form a chemical compound), but rather the carbon atoms may be small enough to be incorporated at interstitials of the metal (in other words of the metal lattice), hence, the metal may be a catalytic metal which allows a segregation of carbon dissolved in the metal.

In general, the solubility of a solute in a solvent may depend on the physical and chemical properties of the solute and the solvent as well as on temperature and pressure. Further, the solubility of a solute (e.g. carbon) in a specific solvent (e.g. Ni) may be referred to as saturation concentration, which is reached when adding more solute into the solvent does not increase the concentration of the solute in the solvent anymore and when, accordingly, the solvent begins to precipitate (or in other words to segregate) the excess amount of solute. Illustratively, a given quantity of a solvent may be able to dissolve a corresponding maximum quantity of a solute defined by the saturation concentration. A solid solution may be also referred to as alloy, e.g. in case of carbon incorporated at interstitials of the metal the solid solution may be referred to as interstitial compound or interstitial alloy.

In analogy, a first metal (e.g. nickel, cobalt, tungsten, iridium, platinum) may form a solid solution (also referred to as solid-state solution) with a second metal (e.g. Cu, Si, Ti, Ta). Illustratively, the metal may act as a solvent for another metal (having for example a similar atomic radius, e.g. 15% or less difference) as a solute. In this case the first metal may not chemically react with the second metal (or may not form a chemical compound), but rather the atoms of the second metal may replace the atoms of the first metal in the crystal lattice (substitutional). A solid solution of at least two metals may be also referred to as alloy; e.g. in case the second metal may be incorporated into the first metal lattice substitutionally, the solid solution may be referred to as substitutional compound or substitutional alloy.

According to various embodiments, alloying a second metal (e.g. Cu) into a first metal (e.g. Ni) may reduce the ability of the first metal for dissolving carbon. In other words, the solubility (the saturation concentration) of carbon in a Ni/Cu alloy may be less than the solubility (the saturation concentration) of carbon in Ni. As a result, dissolving copper into a nickel layer including carbon may support a segregation of carbon from the nickel layer.

According to various embodiments, for forming a graphene layer (in other words for forming a layer including graphene, e.g. a graphene monolayer, a graphene bilayer, or a graphene multilayer) at the surface of a carrier, a layer stack to be annealed may be provided on the carrier. The layer stack to be annealed may include a first layer including at least one metal (e.g. at least one catalytic metal, e.g. at least one transition metal, e.g. at least one of Ni, Co, Ir, Pt, W) and carbon (or another element forming a structural two-dimensional material by segregation from the at least one metal). The layer stack to be annealed may further include a second layer over the first layer, wherein the second layer may include a diffusion barrier material (e.g. a metal, as for example, Cu or Ta, e.g. a metal nitride, as for example, titanium nitride or silicon nitride) hindering carbon diffusion. According to various embodiments, the diffusion barrier material may have a very low ability to solve carbon or may not solve any carbon at all.

FIG. 1 schematically shows a flow diagram of a method 100 for processing a carrier, according to various embodiments. The method 100 for processing a carrier may include: in 110, co-depositing at least one metal from a first source and carbon (or a carbon containing material) from a second source over a surface of the carrier to form a first layer; in 120, forming a second layer over the first layer, the second layer including a diffusion barrier material, wherein the solubility of carbon in the diffusion barrier material is less than in the at least one metal; and, in 130, forming a graphene layer at the surface of the carrier from the first layer by a temperature treatment. Thereby, the second layer may hinder carbon diffusion from the first layer into the second layer or the second layer may hinder carbon diffusion out of the first layer, e.g. through the second layer.

According to various embodiments, depositing the at least one metal may include a first vapor deposition process and depositing carbon may include a second vapor deposition process, wherein the first vapor deposition process and the second vapor deposition process are performed at least one of simultaneously or alternately, which may be referred to as co-deposition. A co-deposition, wherein the at least two deposition processes may be performed alternately, may include forming a plurality of metal layers and a plurality of carbon layers alternately stacked over each other.

According to various embodiments, the first layer may include at least one of a mixture of the deposited at least one metal and the deposited carbon or a solid solution of the at least one metal and the carbon, e.g. an interstitial alloy of the at least one metal dissolving at least a portion of the deposited carbon.

Using two (e.g. separately controlled) deposition processes for forming the first layer may allow controlling the carbon content in the first layer or controlling the quantity of carbon provided in the first layer for forming the graphene layer during the subsequently performed temperature treatment. A temperature treatment (or in other words a heat treatment) may be also referred to as an anneal or annealing. The second vapor deposition process for depositing the carbon may be configured to provide a pre-defined quantity of carbon in the first layer. The pre-defined quantity of carbon provided in the first layer may be greater than a solubility of carbon in the at least one metal of the first layer. Illustratively, undissolved carbon may be included in the first layer. Thereby, the solubility of carbon in the at least one metal of the first layer refers to a temperature of for example 20° C., 50° C. or 100° C. Further, the pressure may not substantially influence the solubility of two solids.

According to various embodiments, using a deposition process which does not rely on thermodynamical phase formation, e.g. using sputtering or pulsed laser deposition, may allow to incorporate more carbon into the first layer 204 as can be dissolved by the at least one metal of the first layer 204, e.g. at least partially as mixture.

According to various embodiments, forming a graphene layer may require a certain number of carbon atoms (e.g. defined by the lattice structure of the graphene sheet) or in other words, normalized to the area, forming a graphene layer may require a pre-defined minimal carbon dose in the first layer before the heat treatment is carried out. According to various embodiments, the second deposition process for depositing the carbon may be configured to provide a carbon dose (in atoms per square centimeter, abbreviated as at/cm$^2$) in the first layer which is greater than about $10^{15}$ at/cm$^2$, or greater than about $3*10^{15}$ at/cm$^2$, or greater than about $6*10^{15}$ at/cm$^2$, or greater than about $10^{16}$ at/cm$^2$, or greater than about $5*10^{16}$ at/cm$^2$, or greater than about $10^{17}$ at/cm$^2$. According to various embodiments, the second deposition process for depositing the carbon may be configured to provide a carbon dose in the first layer in the range from about $10^{15}$ at/cm$^2$ to about $10^{17}$ at/cm$^2$.

According to various embodiments, the temperature treatment (or in other words the anneal) may be performed in the presence of hydrogen. Further, hydrogen may be introduced into the first layer, e.g. into the at least one metal of the first layer or into the carbon of the first layer, to provide hydrogen during the temperature treatment.

The at least one metal of the first layer may be a catalytic metal, e.g. Ni, Co, Ir, Pt, W or another catalytic metal suitable for forming the graphene layer at the surface of the carrier by carbon segregation from the at least one metal of the first layer. According to various embodiments, the top layer of the layer stack which is subjected to the heat treatment (temperature treatment) may be the second layer including the diffusion bather material. In other words, a further metal layer formed over the second layer may be optional.

Further, due to the co-deposition, the carbon may be substantially homogeneously distributed in the first layer and/or in the catalytic metal of the first layer. A co-deposition may include, for example, co-sputtering or co-evaporation. Alternatively, the carbon may be introduced in the first layer and/or in the catalytic metal of the first layer by ion-implantation (cf. FIG. 9).

The heat treatment (the anneal) may support a diffusion of the carbon within the first layer or within the at least one metal of the first layer and into the first layer or into the at least one metal of the first layer. The heat treatment may, for example, support dissolving the carbon in the at least one metal of the first layer, e.g. if the carbon is not already dissolved. Further, e.g. during cooling down, carbon may segregate from the at least one metal of the first layer and may form a graphene layer at the surface of the carrier. The graphene layer may be an interface (or interface layer) between the remaining at least one metal of the first layer and the remaining diffusion barrier material above the graphene layer and the carrier below the graphene layer. The graphene layer may be formed by diffused carbon. Further, the graphene layer may include a graphene monolayer (in other words a single graphene sheet), a graphene bilayer (in other words two graphene sheets stacked over each other in direct physical contact with each other), a graphene trilayer (in other words three graphene sheets stacked over each other in direct physical contact with each other), or a graphene multilayer with more than three graphene sheets stacked over each.

According to various embodiments, the heat treatment may include annealing the carrier, wherein one or more layers being formed over the carrier may be annealed as well. According to various embodiments, the heat treatment may include annealing the one or more layers being formed over the carrier.

According to various embodiments, forming a layer, e.g. the second layer or the third layer, or depositing a metal, e.g. a catalytic metal, or depositing carbon may include a layering process as used in semiconductor industry. A deposition process (e.g. the first vapor deposition and the second vapor deposition to form the first layer, for example in a co-deposition), as referred to herein, may include a chemical vapor deposition (CVD) process and/or a physical vapor deposition (PVD) process. According to various embodiments, a chemical vapor deposition process (CVD process) may include a variety of modifications, as for example atmospheric pressure CVD (APCVD), low pressure CVD (LPCVD), ultrahigh vacuum CVD (UHVCVD), plasma enhanced CVD (PECVD), high density plasma CVD (HDP-CVD), remote plasma enhanced CVD (RPECVD), atomic layer deposition (ALD), atomic layer CVD (ALCVD), vapor phase epitaxy (VPE), metal organic CVD (MOCVD), hybrid physical CVD (HPCVD), and the like. According to various embodiments, carbon, silicon, germanium, nickel, cobalt, iron, ruthenium, rhodium, platinum, iridium, copper, gold, silver, tantalum, titanium nitride, silicon nitride, and the like, may be deposited using LPCVD, ALD, or atomic layer CVD (or using a PVD process). According to various embodiments, physical vapor deposition may include a variety of modifications, as for example sputtering or magnetron sputtering, ion-beam sputtering (IBS), reactive sputtering, high-power impulse magnetron sputtering (HIPIMS), vacuum evaporation, thermal evaporation, molecular beam epitaxy (MBE), pulsed laser deposition, and the like.

According to various embodiments, a carrier (or substrate) or a layer formed over a carrier may be patterned using, for example, a lithographic process (including applying a resist, exposing a resist, and developing a resist), and an etch process (e.g. a wet etch process using etch chemistry or a dry-etch process using, for example, plasma etching, reactive plasma etching, ion beam milling, and the like). Further, patterning a layer or a carrier (a substrate) may include applying a mask layer (e.g. a hard mask layer or a soft mask layer), patterning the mask layer exposing the underlying layer or carrier, and selectively etching the underlying layer or carrier. Further, a patterning process may further include resist stripping, e.g. after the etch process has been carried out.

According to various embodiments, the heating of a carrier (e.g. for performing a heat treatment or an anneal) or heating a layer stack on a carrier may be performed using direct contact heating, e.g. via a hot plate, or by radiation heating, e.g. via a laser or via one or more lamps. According to various embodiments, the heat treatment may be performed under vacuum conditions using, for example, a laser heater or a lamp heater. Parameters of the heat treatment may be at least one of the following: the heating rate (e.g. in the range from about 0.1 K/s to about 50 K/s), the annealing temperature (e.g. in the range from about 600° C. to about 1100° C., e.g. in the range from about 980° C. to about 1000° C.), the annealing duration (e.g. in the range from about 1 min to about 60 min), the cooling rate (e.g. in the range from about 0.1 K/s to about 50 K/s), and, in case the annealing process may be performed in a gas atmosphere, the chemical composition of the annealing gas and the gas pressure of the annealing gas. According to various embodiments, argon or another noble gas may be used to provide a gas atmosphere for the heat treatment, as well as $N_2$, $H_2$, $NH_3$, and/or mixtures from two or more of said gases.

According to various embodiments, a catalytic metal, as described herein, may participate at the formation of the graphene layer, e.g. nickel as catalytic metal layer may allow forming a graphene layer at the interface between the carrier and the catalytic metal layer, wherein the catalytic metal may not primarily chemically react with the carbon. As an example, for processing carbon a corresponding catalytic metal may be any material, which may solve the carbon at high temperatures, wherein there may be no stable phase at room temperatures including the carbon and the catalytic metal, such that the carbon may segregate from the catalytic metal again.

FIG. 2A shows a carrier 202 at various stages during processing, e.g. while method 100 is carried out, according to various embodiments. The carrier 202 may have an upper surface 202a, also referred to as main processing surface of the carrier 202. According to various embodiments, the carrier may be a wafer, a substrate, or any other type of carrier, which may be suitable for performing the respective layering processes (110, 120) and the temperature treatment (130) of method 100, e.g. the carrier 202 may be a coated metal tape or an already processed wafer. According to various embodiments, the carrier 202 may have a thickness direction 201 perpendicular to the main processing surface 202a of the carrier 202. Furthermore, in various embodiments, the carrier 202 may be made of or may include dielectric material (electrically insulating material), such as silicon oxide ($SiO_2$), silicon nitride ($Si_3N_4$), silicon carbide (SiC), aluminum oxide ($Al_2O_3$), boron nitride (BN), hafnium oxide ($HfO_2$), or zirconium oxide ($ZrO_2$).

As illustrated in FIG. 2A, the layer stack 204, 206 may be disposed over the carrier 202 after processes 110 and 120 of method 100 has been carried out, e.g. after the first layer 204 has been formed over the carrier 202 and after the second layer 206 has been formed over the first layer 204.

According to various embodiments, the surface 202a of the carrier 202 (e.g. the main processing surface 202a of the carrier 202) may be at least partially covered with a first layer 204 (e.g. with a first catalytic metal layer). Further, the first layer 204 may be in direct contact with the carrier. According to various embodiments, the first layer 204 may be deposited over the whole surface 202a of the carrier 202, e.g. covering a surface area of the carrier 202 being greater than several square millimeter, e.g. covering a surface area of the carrier 202 being greater than several square centimeter, e.g. covering a surface area of the carrier 202 in the range from about 1 $mm^2$ to about 2000 $cm^2$, e.g. covering a surface area of the carrier 202 in the range from about 1 $mm^2$ to about 1000 $cm^2$. According to various embodiments, applying method 100, as described herein, may not be limited to a specific size of the carrier, as long as the layering processes and the annealing process may be realized. Illustratively, a graphene layer 208 may be formed over an entire wafer 202 during the temperature treatment of the layer stack 204, 206.

According to various embodiments, the first layer 204 may have a thickness (e.g. along the direction 201) in the range from about 5 nm to about 100 nm, e.g. in the range from about 5 nm to about 50 nm. Further, the metal layer 204 may include at least one material of the following group of materials: a transition metal, e.g. nickel, cobalt, iron, ruthenium, rhodium, platinum, iridium, or any other material which may allow solving and segregating the carbon, as described herein.

The carrier 202 may be an electrically insulating carrier or may at least include an electrically insulating surface layer or surface region. The carrier 202 may be an electrically conductive carrier, if it may be desired for a specific application. In other words, the method 100 as described herein may not be limited to a specific kind of carrier.

According to various embodiments, the first layer 204 may be partially or completely covered with the second layer 206. Further, the second layer 206 may be in direct contact with the first layer 204. According to various embodiments, the second layer 206 may be deposited over the whole surface of the first layer 204. Therefore, the lateral extension (e.g. the extension parallel to the surface 202a of the carrier 202) of the second layer 206 may be the same as the lateral extension of the first layer 204.

The second layer 206 may have a thickness in the range from about 2 nm to about 5 µm, e.g. in the range from about 5 nm to about 1 µm. Further, the second layer 206 may include at least one material of the following group of materials: a transition metal, e.g. copper, tantalum, or transition metal nitride, e.g. titanium nitride, or a metalloid nitride, e.g. silicon nitride, or any other material which may not allow substantially solving carbon. Illustratively, the second layer 206 may be configured as carbon diffusion barrier. As illustrated in FIG. 2A, the second layer may be thicker than the first layer.

According to various embodiments, the layer stack 204, 206 may not be substantially influenced during the temperature treatment 130 (in other words during the heat treatment) of method 100 is carried out, if the at least one metal of the first layer 204 and the diffusion barrier material are not dissolvable in each other. In this case, only the carbon may substantially diffuse during the temperature treatment 130 and may form the graphene layer 208 at the surface 202a of the carrier 202. The carrier 202 and the layer stack 204, 206 (or at least the first layer 204) may be subjected to at least a heating process, wherein at least the first layer 204 may be heated up to a desired annealing temperature, wherein at least the first layer 204 may be subjected to the heat for a desired annealing duration, and wherein at least the first layer 204 may be cooled down to room temperature (e.g. 20° C., 25°, 30° C.).

According to various embodiments, after the heat treatment the graphene layer 208 may be covered with a remaining layer 212 including, for example, at least the remaining material of the first layer 204 and the second layer 206 (e.g. the at least one metal of the first layer 204, the diffusion bather material of the second layer 206 and, e.g. if not completely consumed, carbon). The layer stack 204, 206 may be transformed during the heat treatment into the graphene layer 208 and the material layer 212 covering the graphene layer 208.

As illustrated in FIG. 2B, the material layer 212 remaining over the graphene layer 208 after the heat treatment may be removed (e.g. completely) in a subsequently performed etch process 240 (e.g. via an acid, e.g. via $FeCl_3$). Alternatively, the remaining material layer 212 over the graphene layer 208 may be patterned to provide a plurality of contact pads for electrically contacting the graphene layer 208. In this case, the at least one metal of the first layer 204 and the diffusion bather material of the second layer 206 may be electrically conductive, e.g. also after the temperature treatment 130.

As illustrated in FIG. 2C, the carrier 202 may be patterned before the first layer 204 and the second layer 206 may be deposited over the carrier 202. Alternatively, the carrier 202 may include a plurality of structure elements provided on the carrier 202 to be covered with a graphene layer 208 by applying method 100.

Various modifications and/or configurations of the method 100 and details referring to the layer stack formed over the carrier 202 for forming the graphene layer 208 are described in the following, wherein the features and/or functionalities described referring to FIGS. 1 and 2A to 2C may be included analogously. Further, the features and/or functionalities described in the following may be included in the method 100 or may be combined with the method 100, as described before referring to FIGS. 1 and 2A to 2C.

FIG. 3A shows a carrier 202 at various stages during processing, e.g. while method 100 is carried out, according to various embodiments. After the first layer 204 and the second layer 206 have been formed in the processes 110, 120 of method 100, a further process 350 is carried out, the further process 350 may include: forming a third layer 306 over the second layer 206 before the temperature treatment 130 is carried out. The third layer 306 may include at least one metal, e.g. Ni, Co, Ir, Pt, W. The third layer 306 may include a catalytic metal. According to various embodiments, the first layer 204 may include a metal or metal alloy and the third layer 306 may include the same metal or metal alloy as the first layer 204. According to various embodiments, the layer stack 204, 206, 306 may not be substantially influenced during the temperature treatment 130 of method 100 is carried out, if the at least one metal of the first layer 204, the diffusion barrier material, and the at least one metal of the third layer 306 are not dissolvable in each other. In this case, only the carbon may substantially diffuse during the temperature treatment 130 and may form the graphene layer 208 at the surface 202*a* of the carrier 202.

The third layer 306 may have a thickness in the range from about 2 nm to about 5 μm, e.g. in the range from about 5 nm to about 1 μm, e.g. in the range from about 10 nm to about 1 μm. Further, the third layer 306 may include at least one material of the following group of materials: a transition metal, e.g. nickel, cobalt, iron, ruthenium, rhodium, platinum, iridium. The thickness of the third layer 306 may be greater than the thickness of the first layer 204, e.g. the ratio between the layer thicknesses of the third layer 306 and the first layer 204 may be greater than about 1, e.g. greater than about 1.5, e.g. greater than about 2, e.g. greater than about 4, e.g. in the range from about 1.5 to about 20. Therefore, according to various embodiments, the segregation of carbon may take place at the surface 202*a* of the carrier 202, since the diffusion distance of the carbon to a surface 306*a* of the third layer 306 may be greater than the diffusion distance of the carbon to the surface 202*a* of the carrier 202, and the segregation may in general either take place at the surface 306*a* of the third layer 306 or at the surface 202*a* of the carrier 202. Further, the diffusion bather layer 206 may support the segregation of carbon at the surface 202*a* of the carrier 202.

Further, the material layer 212 remaining over the graphene layer 208 after the heat treatment 130 may be removed (e.g. completely) in a subsequently performed etch process 240. Alternatively, the remaining material layer 212 over the graphene layer 208 may be patterned to provide a plurality of contact pads for electrically contacting the graphene layer 208. In this case, the at least one metal of the first layer 204 and the diffusion bather material of the second layer 206 may be electrically conductive, e.g. also after the temperature treatment 130. According to various embodiments, removing the remaining material layer 212 or partially removing (e.g. patterning) the remaining material layer 212 may include wet etching or dry etching, e.g. plasma etching or reactive ion etching.

Figure 3B:
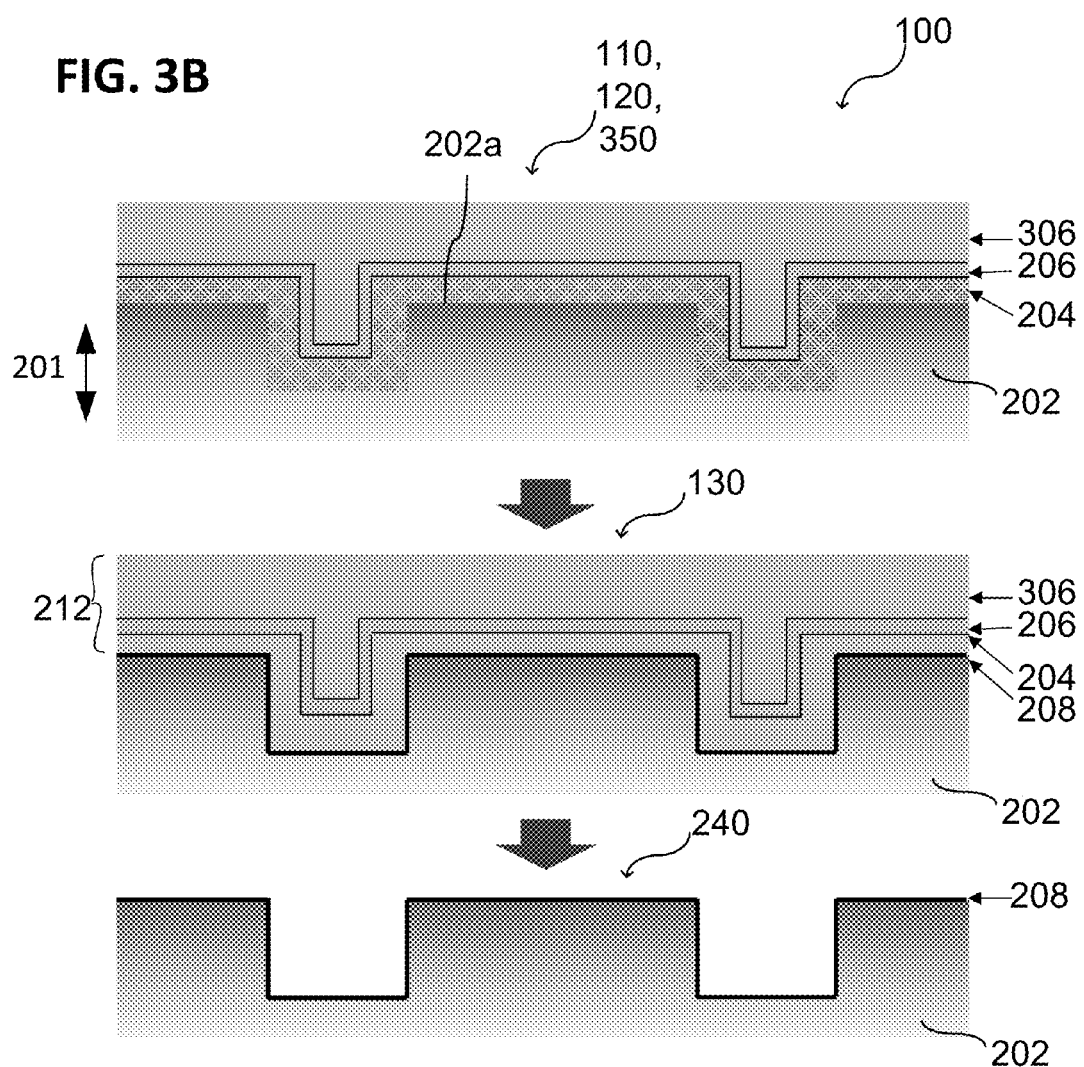

As illustrated in FIG. 3B, the carrier 202 may be patterned before the first layer 204, the second layer 206, and the third layer 306 may be deposited over the carrier 202, as already described. Alternatively, the carrier 202 may include a plurality of structure elements provided on the carrier 202 to be at least partially covered with a graphene layer 208 by applying method 100.

In the following, e.g. in FIGS. 4A to 4F and in FIGS. 5A and 5B, a method 100 for processing the carrier 202 may be described, wherein the diffusion bather layer 206 (referred to as the second layer 206) may be dissolved in the first layer 204 or in the at least one metal of the first layer 204 (cf. FIGS. 2A to 2C) or in the first layer 204 and in the third layer 306 or in the at least one metal of the first layer 204 and in the at least one metal of the third layer 306 (cf. FIGS. 3A and 3B). Illustratively, the diffusion bather material may be dissolved in the catalytic material which may assist the segregation and/or the diffusion of carbon to the surface 202*a* or the carrier 202.

Figure 4A:
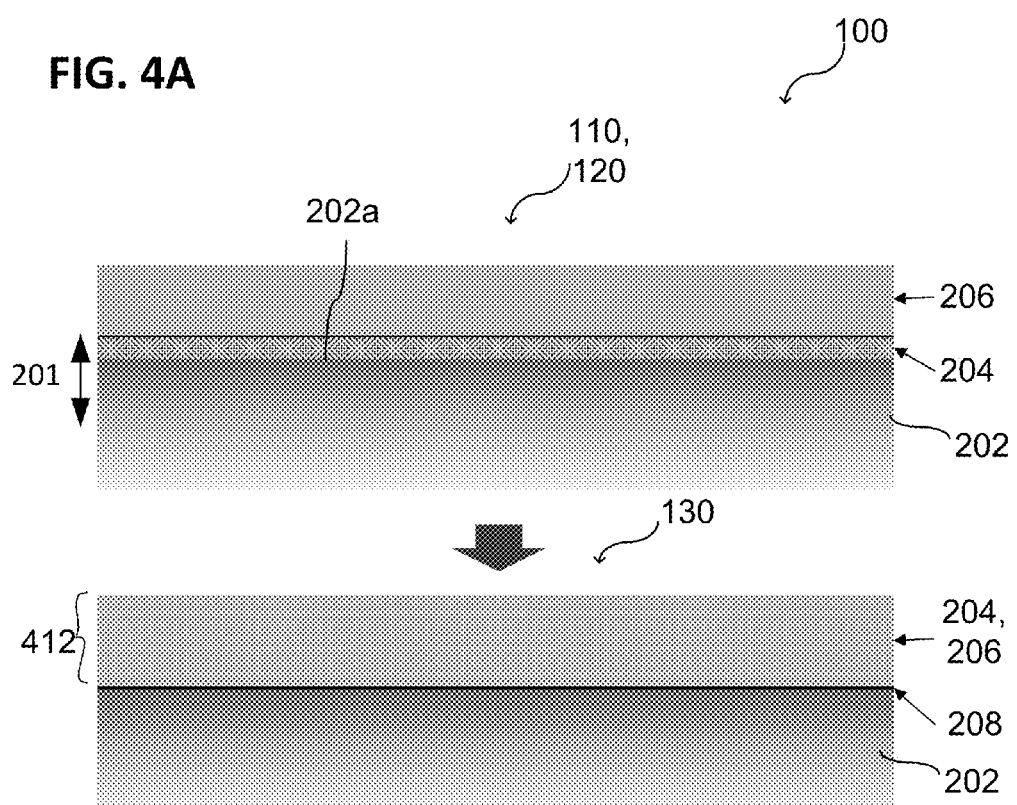

FIG. 4A shows a carrier 202 at various stages during processing, e.g. while method 100 is carried out, according to various embodiments, wherein the at least one metal of the first layer 204 and the diffusion bather material of the second layer 206 are selected so that an alloy (e.g. a solid solution) is formed during the temperature treatment 130 from the at least one metal of the first layer 204 and from the diffusion barrier material of the second layer 206. The alloy formed during the temperature treatment 130 may be disposed as alloy layer 412 over the graphene layer 208. The alloy layer 412 may or may not include a homogeneous distribution of the at least one metal of the first layer 204 and the diffusion bather material of the second layer 206. According to various embodiments, the solubility of carbon in the alloy may be less than the solubility of carbon in the at least one metal of the first layer 204. This may support the segregation of carbon at the interface to the carrier 202 and, therefore, the formation of the graphene layer 208. According to various embodiments, if the first layer 204 includes carbon dissolved in nickel, and the second layer 206 includes copper as a diffusion barrier, a nickel/copper alloy may be formed during the temperature treatment 130 which may not be able to dissolve the same concentration of carbon as the nickel of the first layer 204. In other words, the nickel/copper alloy may have a smaller saturation concentration (solubility) for carbon than nickel.

Figure 4B:
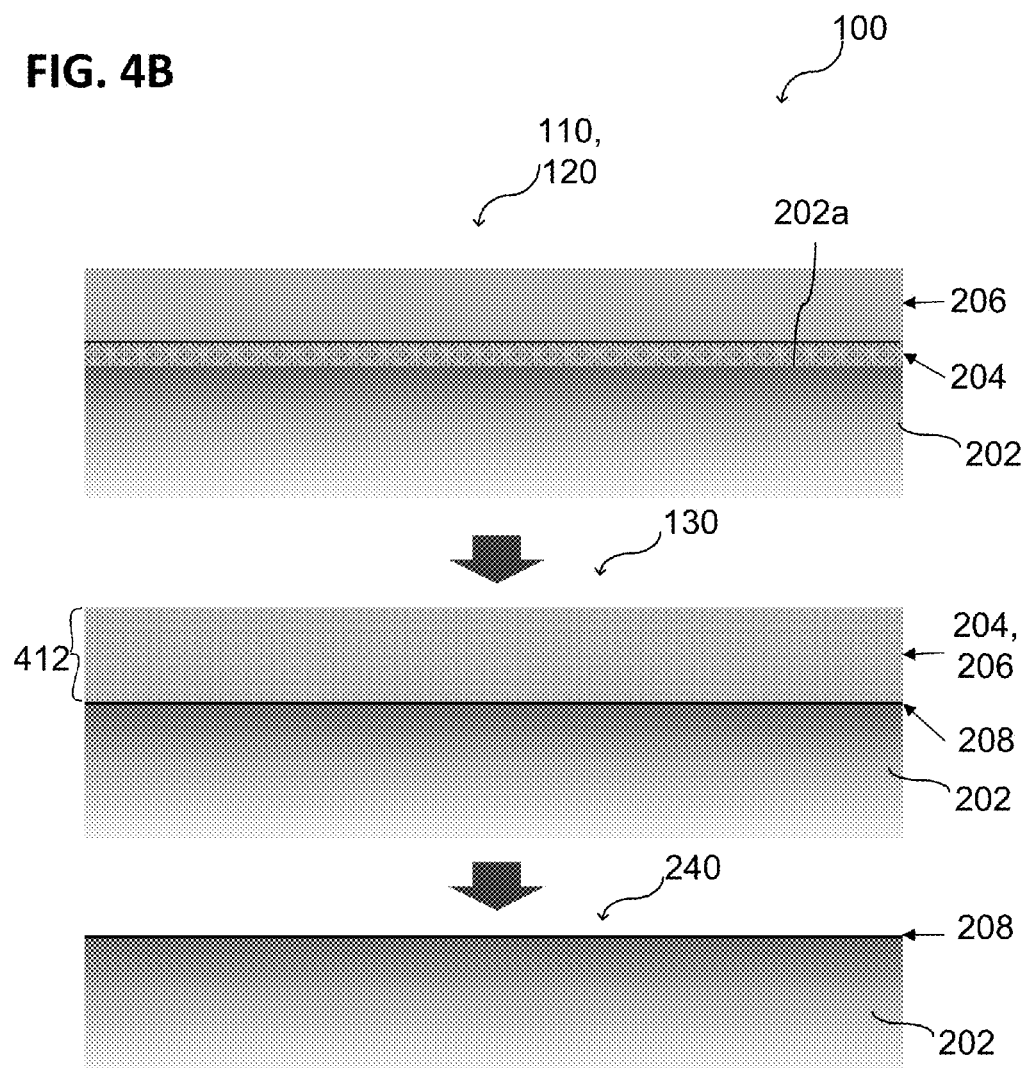

Further, the alloy layer 412 disposed over the graphene layer 208 after the temperature treatment 130 may be removed (e.g. completely) in a subsequently performed etch process 240, as illustrated in FIG. 4B. Alternatively, the alloy layer 412 over the graphene layer 208 may be patterned to provide a plurality of contact pads for electrically contacting the graphene layer 208. In this case, the at least one metal of the first layer 204 and the diffusion bather material of the second layer 206 may be electrically conductive, e.g. also after the temperature treatment 130. Illustratively. the alloy of the alloy layer 412 may be electrically conductive. According to various embodiments, removing the alloy layer 412 or partially removing (e.g. patterning) the alloy layer 412 may include wet etching or dry etching, e.g. plasma etching or reactive ion etching.

As illustrated in FIG. 4C, the second layer 206 and the first layer 204 may be patterned 460*a* before the temperature treatment 130 is carried out, e.g. by means of wet etching or dry etching. The surface 202*a* of the carrier 202 may be partially exposed by the patterning 460*a*. After the temperature treatment 130 has been carried out, the surface 202*a* of the carrier 202 may be still partially exposed. Illustratively, a patterned alloy layer 414 and a patterned graphene layer 208*p* may be formed by the temperature treatment 130. After patterning 460*a*, the patterned alloy layer 414 may be used as electrical contacts for electrically contacting the patterned graphene layer 208*p*. In this case, the patterned alloy layer 414 may not be removed completely in further processing.

Optionally, the patterned graphene layer 208*p* may be exposed by removing 240 (e.g. etching) the patterned alloy layer 414. Illustratively, a patterned graphene layer 208*p* may be provided by patterning the layer stack 204, 206 prior to the temperature treatment 130.

Figure 4D:
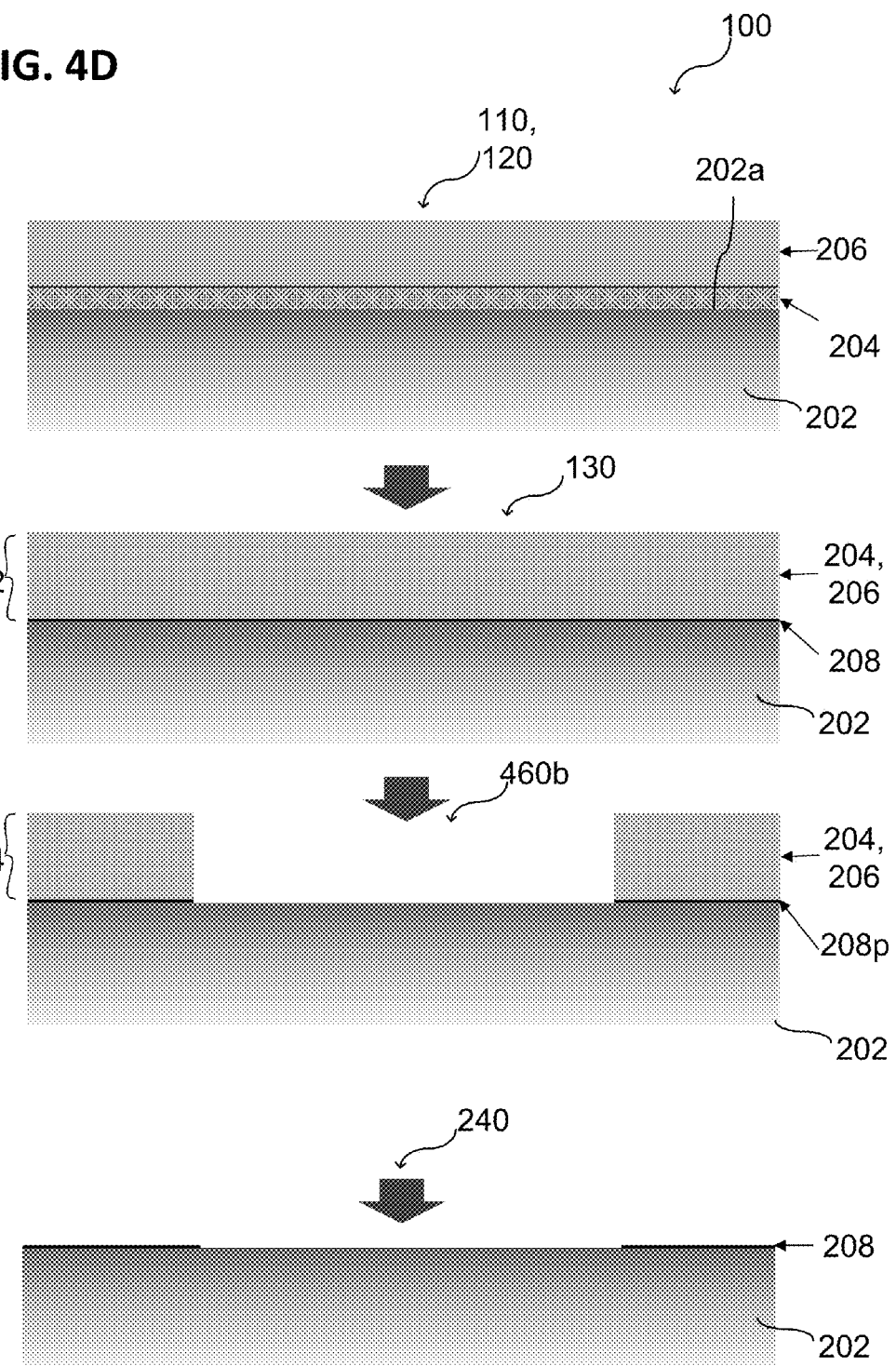

Alternatively, as illustrated in FIG. 4D, the alloy layer 412 and the graphene layer 208 formed by the temperature treatment 130 may be patterned 460*b* after the temperature treatment 130, e.g. by etching, e.g. by one or more etch processes. After patterning 460*b*, the patterned alloy layer 414 may be used as electrical contacts for electrically contacting the patterned graphene layer 208*p*. In this case, the patterned alloy layer 414 may not be removed completely in further processing.

Optionally, the patterned graphene layer 208*p* may be exposed by removing 240 (e.g. etching) the patterned alloy layer 414. Illustratively, a patterned graphene layer 208*p* may be provided by patterning the alloy layer 412 and the graphene layer 208 after the temperature treatment 130.

Figure 4E:
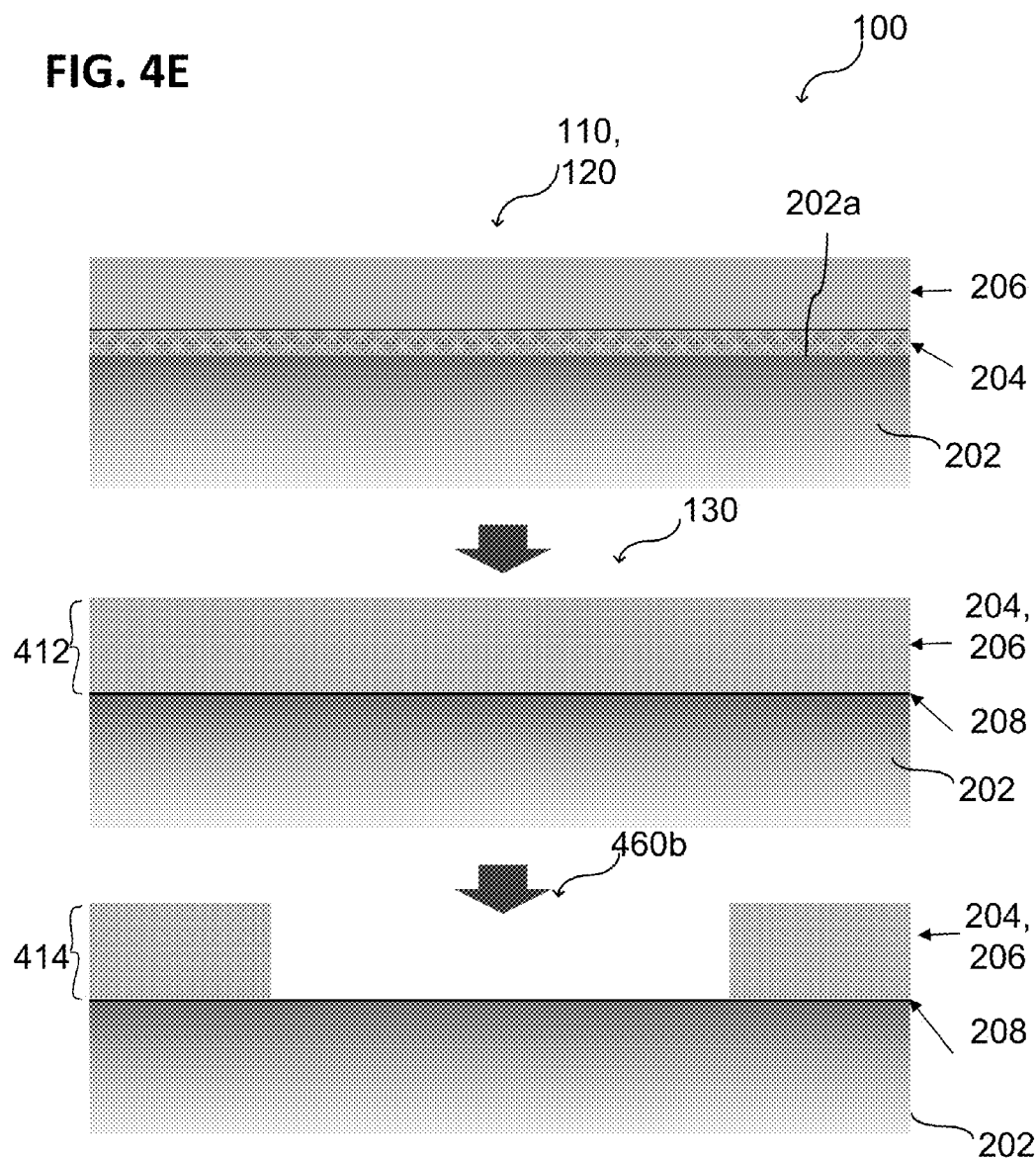

In an embodiment, as illustrated in FIG. 4E, only the alloy layer 412 may be patterned 460*b* after the heat treatment, to provide a graphene layer 208 being, for example, electrically contacted by the patterned alloy layer 414. Illustratively, the graphene layer 208 may be partially exposed by patterning the alloy layer 412.

Figure 4F:
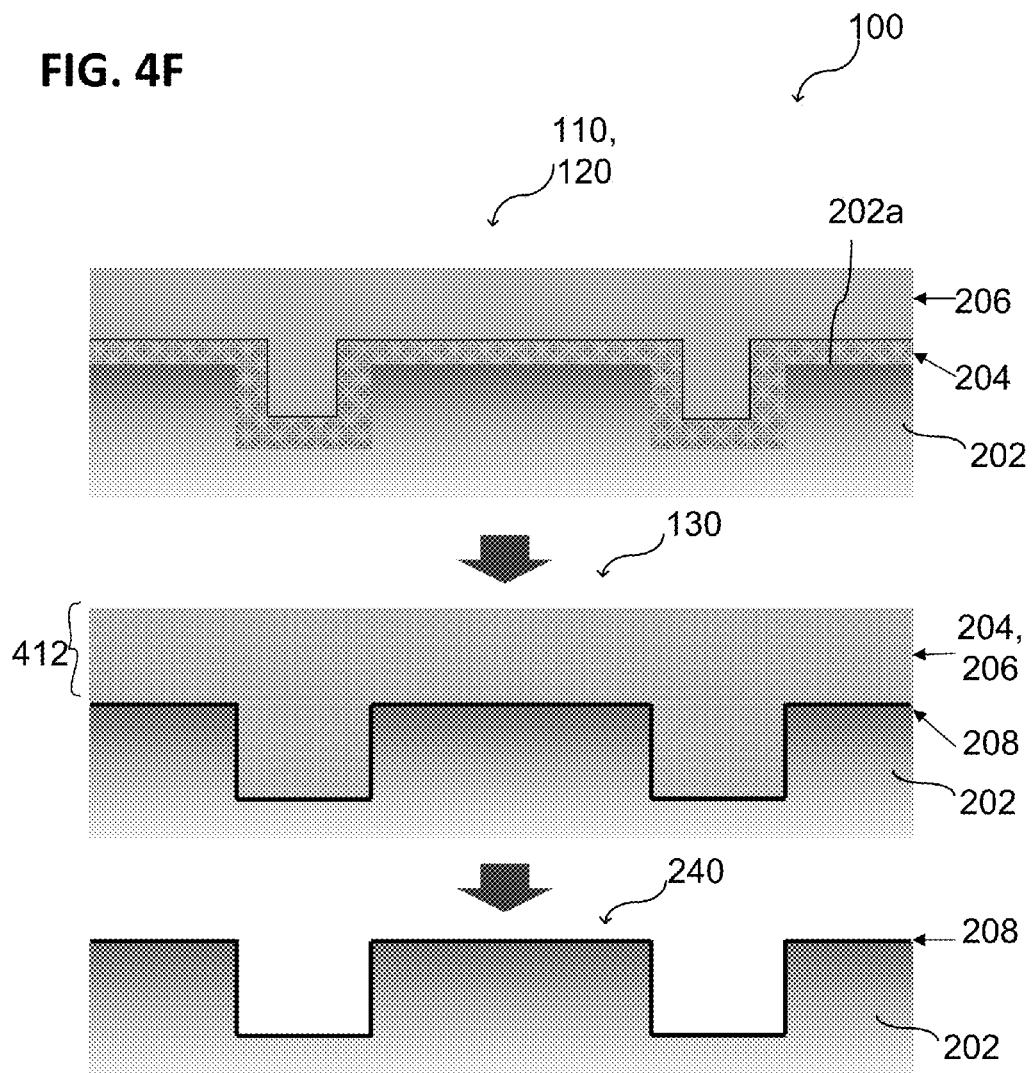

FIG. 4F illustrates the carrier 202 at various stages during method 100 is carried out, wherein the carrier 202 is patterned before the method 100 is applied for forming a graphene layer 208 over the surface of the patterned carrier 202, as already described. Alternatively, the carrier 202 may include a plurality of structure elements provided on the carrier 202 to be covered with a graphene layer 208 by applying method 100. According to various embodiments, the alloy layer 412 formed over the graphene layer 208 during the heat treatment may be removed 240, e.g. completely or partially, e.g. by etching.

According to various embodiments, in case the carrier 202 may be patterned or may include structure elements at the surface 202a of the carrier 202, the graphene layer 208 may conformally cover the surface 202a of the carrier 202 and/or the structure elements at the surface 202a of the carrier 202. As illustrated for example in FIG. 4D, the alloy layer 412 disposed over the graphene layer 208 may serve as a hard mask 414 for patterning the graphene layer 208. The hard mask 414 may be provided by patterning the alloy layer 412.

Figure 5A:
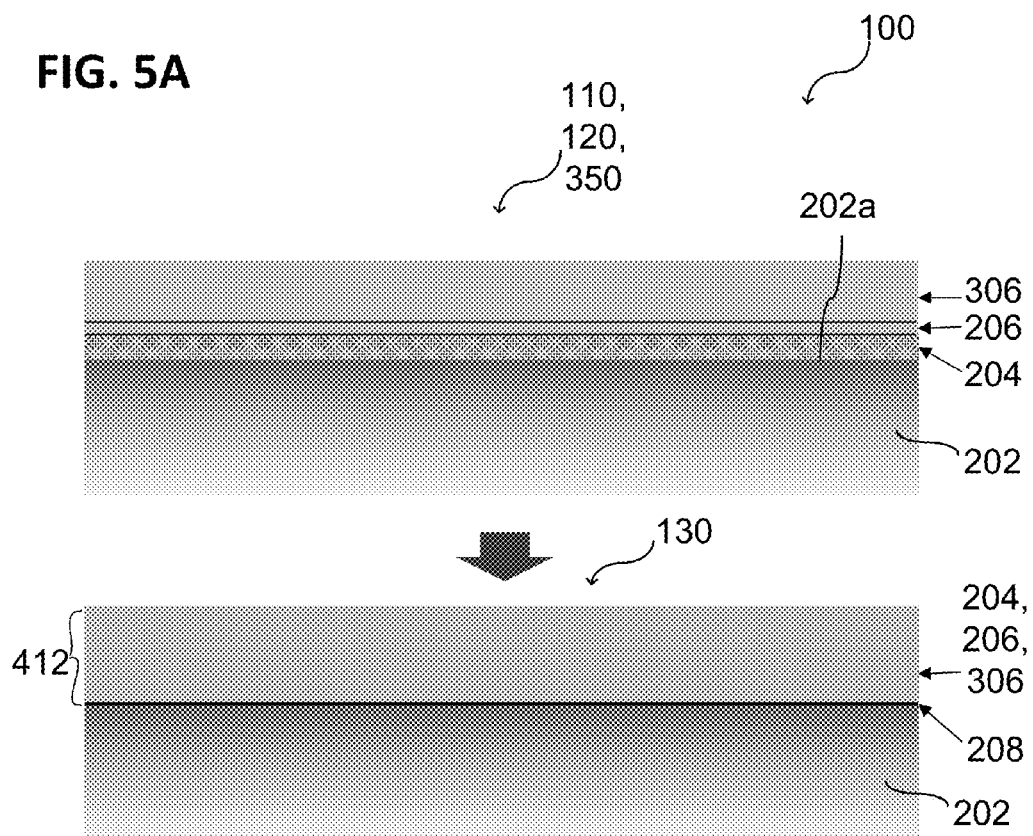

FIG. 5A shows a carrier 202 at various stages during processing, e.g. while method 100 is carried out, according to various embodiments, wherein the at least one metal of the first layer 204, the diffusion barrier material of the second layer 206, and the at least one metal of the third layer 306 are selected so that an alloy (e.g. a solid solution) is formed during the temperature treatment 130 from the at least one metal of the first layer 204, from the diffusion bather material of the second layer 206, and from the at least one metal of the third layer 306. The alloy formed during the temperature treatment 130 may be disposed as alloy layer 412 over the graphene layer 208. The alloy layer 412 may or may not include a homogeneous distribution of the at least one metal of the first layer 204, the diffusion barrier material of the second layer 206, and the at least one metal of the third layer 306. According to various embodiments, the solubility of carbon in the alloy may be less than the solubility of carbon in the at least one metal of the first layer 204. This may support the segregation of carbon at the interface to the carrier 202 and, therefore, the formation of the graphene layer 208. According to various embodiments, if the first layer 204 includes carbon dissolved in nickel, the second layer 206 includes copper as a diffusion barrier, and the third layer includes nickel (e.g. without carbon), a nickel/copper alloy may be formed during the temperature treatment 130 which may not be able to dissolve the same concentration of carbon. In other words, the nickel/copper alloy may have a smaller saturation concentration for carbon than nickel.

Figure 5B:
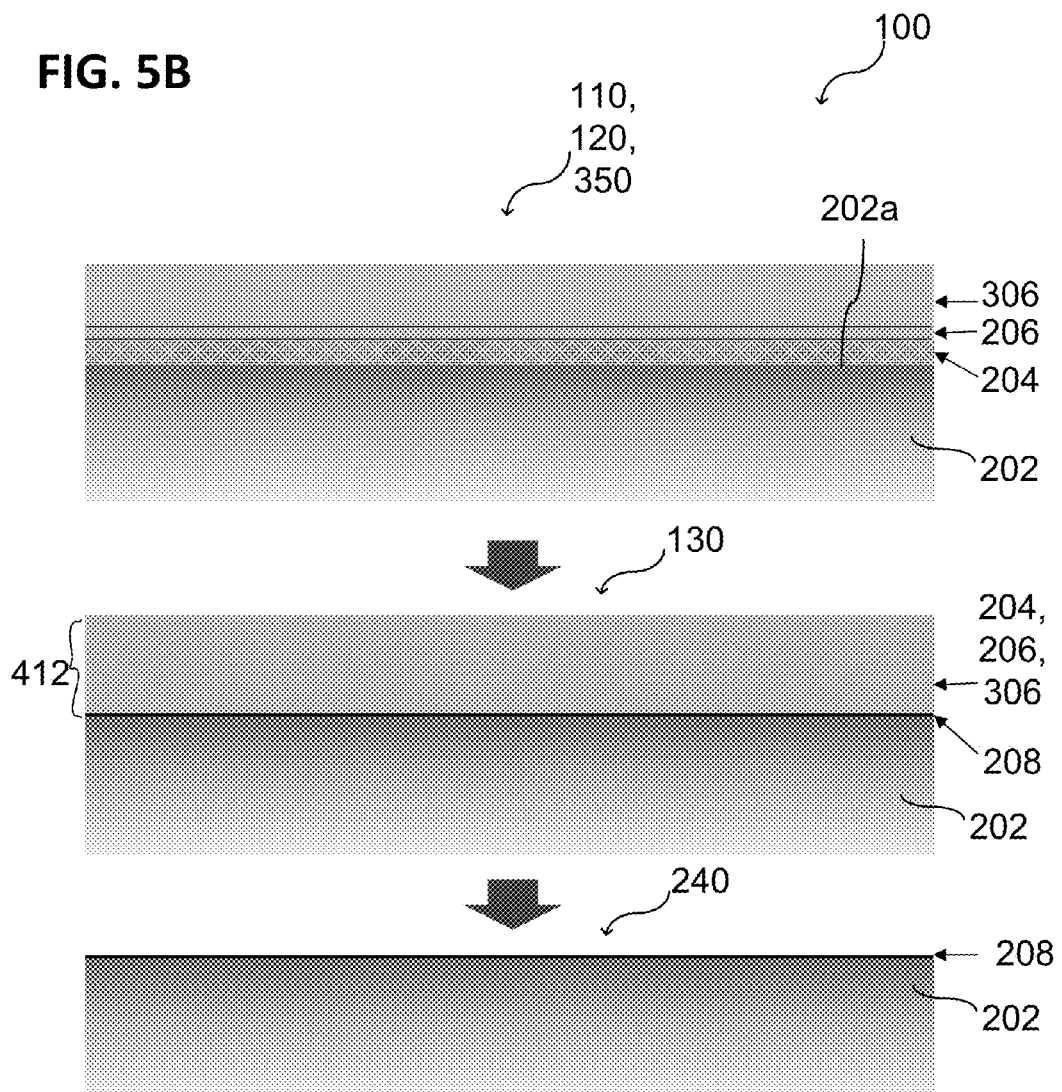

Further, the alloy layer 412 disposed over the graphene layer 208 after the temperature treatment 130 may be removed (e.g. completely) in a subsequently performed etch process 240, as illustrated in FIG. 5B. Alternatively, the alloy layer 412 over the graphene layer 208 may be patterned to provide a plurality of contact pads for electrically contacting the graphene layer 208, as already described. In this case, the at least one metal of the first layer 204, the diffusion barrier material of the second layer 206, and the at least one metal of the third layer 306 may be electrically conductive, e.g. also after the temperature treatment 130. Illustratively, the alloy layer 412 may be electrically conductive. According to various embodiments, removing the alloy layer 412 or partially removing (e.g. patterning) the alloy layer 412 may include wet etching or dry etching, e.g. plasma etching or reactive ion etching.

FIG. 5C illustrates the carrier 202 at various stages during method 100 is carried out, wherein the carrier 202 is patterned before the method 100 is applied for forming a graphene layer 208 over the surface 202a of the patterned carrier 202, as already described. Alternatively, the carrier 202 may include a plurality of structure elements provided on the carrier 202 to be covered with a graphene layer 208 by applying method 100. According to various embodiments, the alloy layer 412 formed over the graphene layer 208 during the heat treatment may be removed 240, e.g. completely or partially, e.g. by etching.

Figure 6:
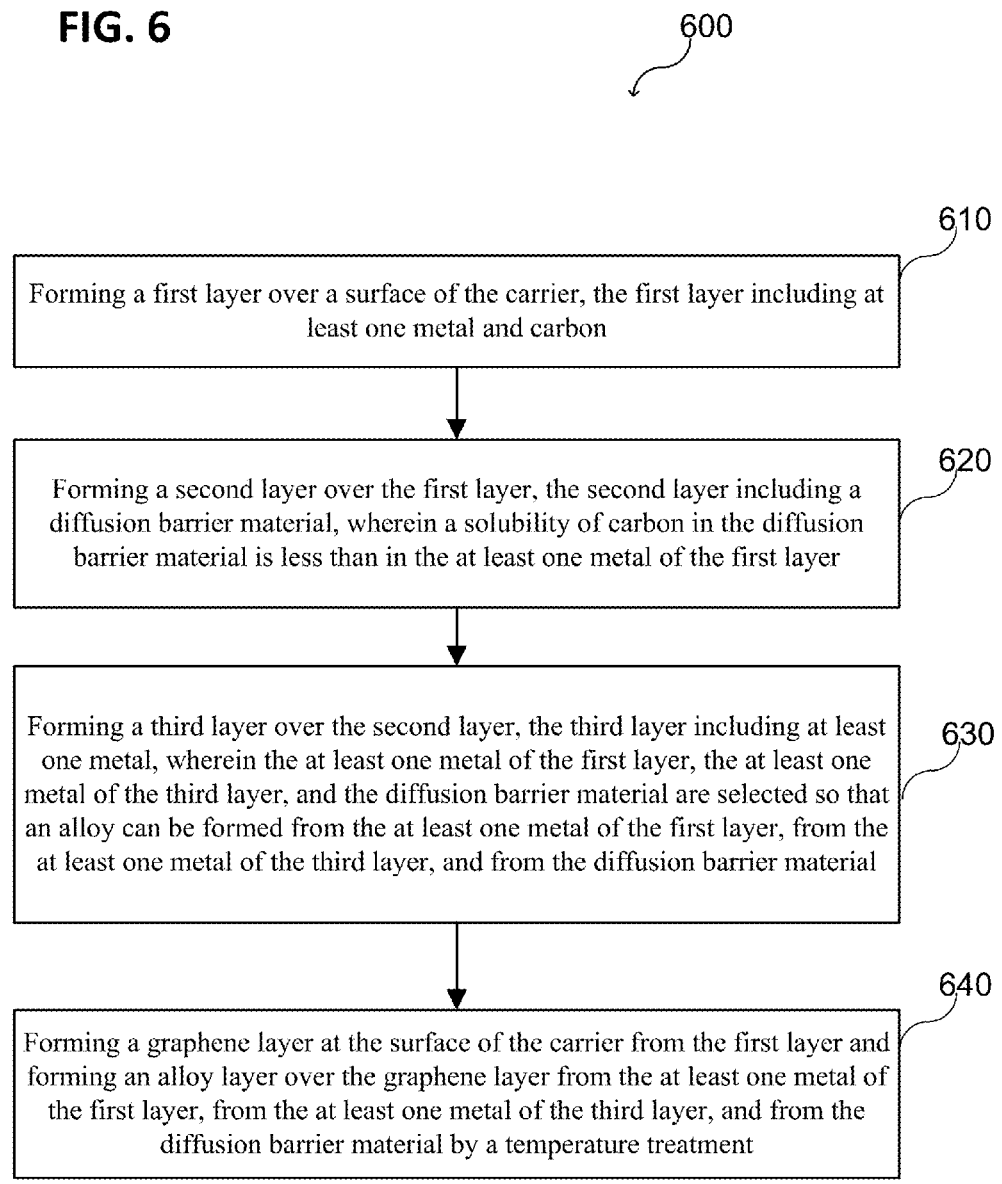
FIG. 6 shows a schematic flow diagram of a method for processing a carrier according to various embodiments.

FIG. 6 schematically shows a flow diagram of a method 600 for processing a carrier, according to various embodiments. The method 600 for processing a carrier may include: in 610, forming a first layer over a surface of the carrier, the first layer including at least one metal and carbon; in 620, forming a second layer over the first layer, the second layer including a diffusion barrier material, wherein a solubility of carbon in the diffusion barrier material is less than in the at least one metal of the first layer; in 630, forming a third layer over the second layer, the third layer including at least one metal, wherein the at least one metal of the first layer, the at least one metal of the third layer, and the diffusion barrier material are selected so that an alloy can be formed from the at least one metal of the first layer, from the at least one metal of the third layer, and from the diffusion barrier material, and, in 640, forming a graphene layer at the surface of the carrier from the first layer and forming an alloy layer over the graphene layer from the at least one metal of the first layer, from the at least one metal of the third layer, and from the diffusion barrier material by a temperature treatment. Thereby, the second layer may hinder carbon diffusion from the first layer into the second layer or the second layer may hinder carbon diffusion out of the first layer, e.g. through the second layer.

Figure 7A:
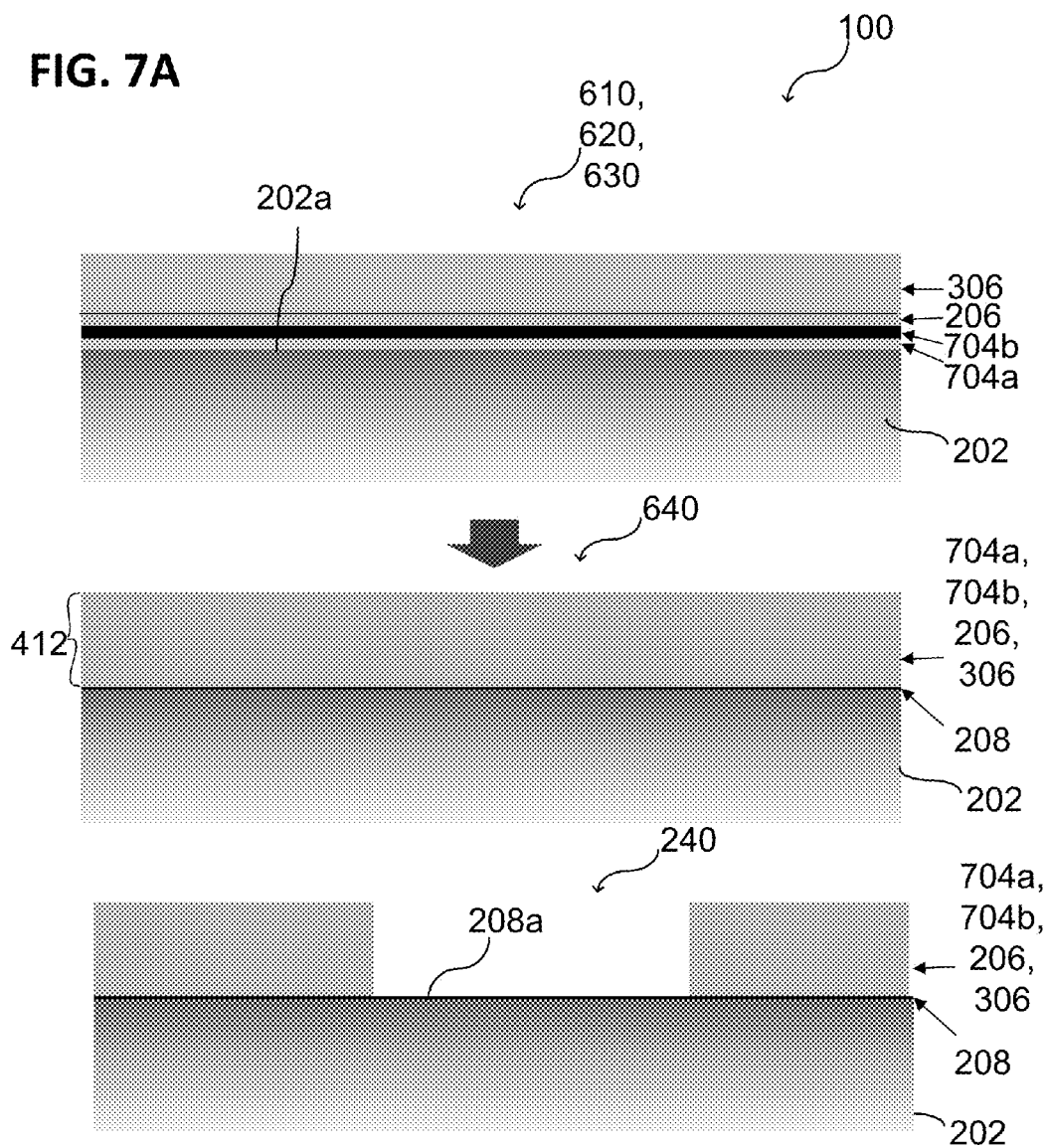
FIGS. 7A and 7B show respectively a carrier at various stages during processing in a schematic cross sectional view or side view according to various embodiments.

FIG. 7A illustrates the carrier 202 at various stages during method 600 is carried out according to various embodiments. According to various embodiments, forming the first layer 204 may include forming a first metal layer 704a and forming a carbon source layer 704b over the first metal layer 704a. After processes 610, 620, and 630 of method 600 have been carried out, the layer stack 704a, 704b, 206, 306 formed over the carrier 202 may be subjected to a temperature treatment 640 (in analogy to the temperature treatment 130, as already described). The alloy layer 412 disposed over the graphene layer 208 after the temperature treatment 640, may be patterned subsequently, as already described.

Figure 7B:
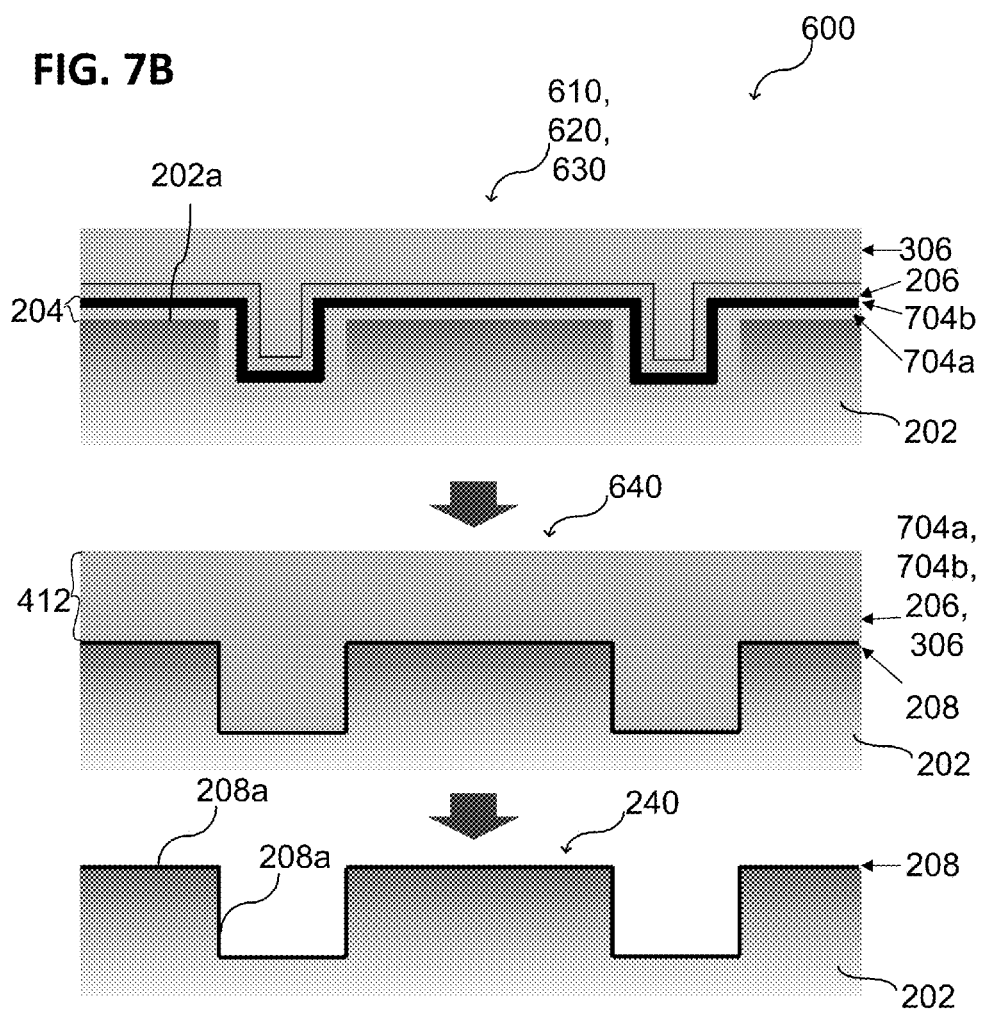

FIG. 7B illustrates the carrier 202 at various stages during method 600 is carried out, wherein the carrier 202 is patterned before the method 600 is applied for forming a graphene layer 208 over the surface 202a of the patterned carrier 202, as already described. Alternatively, the carrier 202 may include a plurality of structure elements provided on the carrier 202 to be covered with a graphene layer 208 by applying method 600. According to various embodiments, the alloy layer 412 formed over the graphene layer 208 during the temperature treatment 640 may be removed 240, e.g. completely or partially, e.g. by etching.

As described with reference to FIGS. 7A and 7B, the first metal layer 704a (also referred to as first catalytic metal layer 704a) may include or may consist of a first catalytic metal, e.g. nickel, cobalt, iron, ruthenium, rhodium, platinum, and/or iridium, and the source layer 704b disposed over the first metal layer 704a may include carbon or a carbon containing compound which is able to feed carbon into the first metal layer 704a during the temperature treatment. The second layer 206 may be a carbon diffusion bather layer 206, as already described, and the third layer 306 (also referred to as second catalytic metal layer 306) may include or may consist of a second catalytic metal, e.g. nickel, cobalt, iron, ruthenium, rhodium, platinum, and/or iridium. The first metal layer 704a and the second metal layer 704b may include or may consist of the same metal or metal alloy, e.g. at least prior to the temperature treatment 640.

The first metal layer 704a may have a thickness of about 20 nm (or for example a thickness in the range from about 5 nm to about 100 nm) and may be deposited using a CVD process or a PVD process. The carbon layer 704b may have a thickness of about 1 nm (or for example a thickness in the range from about 0.2 nm to about 10 nm) and may be deposited using a CVD process or a PVD process. The carbon layer 704b may further include a controlled quantity of hydrogen, which may be introduced into the carbon layer 704b during the deposition of carbon layer 704b or in a hydrogenation process afterwards. The carbon layer 704b may be the carbon source for forming the graphene sheet 208 during the heat treatment 640 (in other words during the annealing process). Further, the diffusion bather layer 206 may be deposited over the carbon layer 704b. The diffusion bather layer 206 may prevent carbon from the carbon layer 704b to diffuse through the second metal layer 306, and therefore, the carbon from the carbon layer 704b may segregate at the surface 202a of the carrier 202. This may allow performing a simple etch process for removing the annealed layer stack 412 (or in other words the alloy layer 412 formed over the graphene layer 208 by the temperature treatment 640) to expose the surface 208a of the graphene layer 208, e.g. partially or completely.

Further, the second metal layer 306 may be formed over the diffusion bather layer 206. The second metal layer 306 may have a thickness of about 100 nm (or for example a thickness in the range from about 10 nm to about 1000 nm) and may be deposited using a CVD process or a PVD process.

The layer stack, e.g. including the two metal layers 704a, 306, the diffusion barrier layer 206, and the carbon layer 704b disposed between the first metal layer 704a and the diffusion barrier layer 206, may be annealed in an annealing process 640 (also referred to as heat treatment or temperature treatment). The carrier 202 including the layer stack 704a, 704b, 206, 306 may be heated up to an annealing temperature in the range from about 600° C. to about 1100° C., with a heating rate in the range from about 0.1° K/s to about 50° K/s. The annealing duration may be in range from about 1 min to about 60 min (or even longer than 60 min) Further, according to various embodiments, the cooling rate may be in the range from about 0.1° K/s to about 50° K/s.

During the annealing process, e.g. during process 640 of method 600, the carbon layer 704b may be disintegrated, since the carbon may diffuse into (or may be solved in) the first metal layer 704a. The catalytic metal may be selected so that the catalytic metal may not form a stable phase including carbon, e.g. at least in a certain composition and temperature range. Therefore, carbon being solved in the first metal layer 704a may segregate from the first metal layer 704a, e.g. during heating and/or cooling of the carrier 202. Since the carbon may be introduced into the first metal layer 704a near the carrier 202, the carbon may segregate exclusively at the interface between the carrier 202 and the first metal layer 704a, e.g. at the surface 202a of the carrier 202. The carbon being segregated from the first metal layer 704a may form the graphene monolayer 208 during cooling, e.g. the graphene sheet 208. Further, the carbon being segregated from the first metal layer 704a may form a graphene bilayer 208 during cooling, e.g. a graphene layer 208 including two graphene monolayers stacked above each other. Further, the carbon being segregated from the first metal layer 704a may form a graphene multilayer during cooling, e.g. a graphene layer 208 including a multiplicity of graphene monolayers stacked above each other. Further, method 600 may allow the controlled growth of a carbon monolayer, a carbon bilayer, or a carbon multilayer, depending on the quantity of hydrogen being introduced into the carbon layer 704b prior to the temperature treatment 640 or being introduced into the first metal layer 704a during the temperature treatment 640 or being introduced into the graphene layer 208 during the temperature treatment 640. According to various embodiments, introducing hydrogen into the carbon layer 704b may cause the formation of a graphene monolayer 208 during the temperature treatment 640, wherein in absence of hydrogen a graphene bilayer 208 or a graphene multilayer 208 may be formed during the temperature treatment 640.

The temperature treatment 640 may be performed under vacuum conditions, e.g. in high vacuum. Further, during the temperature treatment 640, an annealing gas may be utilized, e.g. at least one of argon (or another inert gas), nitrogen, hydrogen, ammonia, and the like. Using a process gas (or an annealing gas) may allow introducing hydrogen into the carbon layer 704b or into the graphene sheet (graphene layer) 208 formed during the temperature treatment 640.

According to various embodiments, a pre-saturation of the catalytic metal with hydrogen may cause the formation of a graphene monolayer 208 during the temperature treatment 640, wherein a graphene multilayer 208 may be formed without a hydrogen pre-saturation of the catalytic metal. The carbon layer 704b may be deposited using a hydrogen free carbon PVD process. The carbon layer 704b may be deposited using a carbon PVD, a plasma-enhanced CVD (PECVD) or a thermal CVD (LPCVD, APCVD) process which may allow introducing a controlled quantity of hydrogen into the carbon layer 704b.

Since the carbon of the carbon layer 704b may form the graphene sheet 208 at the surface 202a of the carrier 202 (during the temperature treatment 640 and/or after the temperature treatment 640), e.g. directly on the carrier 202, the remaining material layer 414 (or in other words the remaining alloy layer 412) may be easily removed in a subsequently performed etch process 240.

Further, using one or more conformal deposition processes, such as LPCVD or ALD, the layer stack 704a, 704b, 206, 306 may also be formed over one or more three-dimensional structures, e.g. over one or more structure elements being arranged on the carrier, e.g. over one or more recesses being arranged in the carrier, as shown for example in FIG. 7B. Therefore, method 600 may allow forming one of a graphene monolayer, a graphene bilayer, and a graphene multilayer over one or more three-dimensional structures. Method 600, as described herein, may allow the formation of a graphene sheet 208 directly on a carrier 202, as shown for example in FIGS. 7A and 7B. Method 600, as described herein, may allow the formation of a graphene sheet 208 via an asymmetric segregation of carbon from a catalytic metal layer, the carbon being previously solved in the catalytic metal layer. As described herein, the formation of graphene and/or the formation of one or more metal-carbide-phases within the remaining material 212, 412 over the graphene layer 208 may be prevented or at least reduced. Further, controlling the hydrogen content during the annealing process or during the formation of the carbon layer 704*b* may allow the control of the carbon segregation forming a graphene monolayer, a graphene bilayer, or a graphene multilayer.

The graphene sheet 208, as described herein, may have an ampacity (current-carrying capability) of up to $10^8$ A/cm$^2$ so that a very high heating output may be generated without destruction of the graphene sheet. Graphene may be used as an electrode or as a charge carrying structure, wherein method 100, method 600 and method 800, as described herein (cf. FIGS. 1, 6, and 8), may be utilized to form a conformal graphene layer over a patterned base structure.

According to various embodiments, a method for processing a carrier, as described herein, may include annealing a layer stack, the layer stack including a carbon source layer 704*b* (e.g. including carbon as a source material) and one or more catalytic metal layers (e.g. the one or more catalytic metal layers including a catalytic metal with respect to the carbon), wherein the carbon source layer 704*b* may be arranged within the layer stack such that the distance from the carbon source layer 704*b* to the surface 202*a* of the carrier 202 may be smaller than the distance from the carbon source layer 704*b* to the top surface of the layer stack. Therefore, the carbon diffused or dissolved from the source layer 704*b* may segregate asymmetrically during and/or after the temperature treatment, such that graphene may be formed at the surface 202*a* of the carrier 202, the graphene forming an interface between the carrier 202 and the remaining (annealed) layer stack 412 over the graphene. According to various embodiments, the source layer 704*b*, e.g. the carbon layer 704*b* of the first layer 204, may have a thickness in the range from about 0.2 nm to about 10 nm, e.g. in the range from about 1 nm to about 10 nm.

The layer stack to be annealed may include additional layers, e.g. additional layers including catalytic material, or other materials influencing the segregation and/or diffusion process of the source material, e.g. additional barrier layers or diffusion layers assisting or controlling the diffusion of the source material (not shown).

According to various embodiments, as for example illustrated in FIGS. 7A and 7B, a method for processing a carrier may include: forming a first catalytic metal layer 704*a* over a carrier 202; forming a source layer 704*b* over the first catalytic metal layer 704*a* (the source layer including a source material, e.g. carbon); forming a diffusion barrier layer 206 and/or a second catalytic metal layer 306 over the source layer 704*b*, wherein the thickness of the diffusion barrier layer 206 may be greater than the thickness of the first catalytic metal layer 704*a* and/or wherein the thickness of the second catalytic metal layer 306 may be greater than the thickness of the first catalytic metal layer 704*a*; and subsequently performing an anneal to diffuse the source material of the source layer, thereby forming a layer adjacent to the surface 202*a* of the carrier 202 from the diffused material of the source layer 704*b*.

According to various embodiments, the method for processing a carrier may further include adapting the carbon content in the first layer 204 or, in analogy, adapting the thickness of the carbon source layer 704*b* over the first metal layer 704*a* as well as adapting the temperature treatment so that a conformal carbon monolayer 208 may be formed during the temperature treatment, the monolayer having a two-dimensional lattice structure.

FIG. 8 schematically shows a flow diagram of a method 800 for processing a carrier, according to various embodiments. The method 800 for processing a carrier 202 may include: in 810, forming a first layer 204 over a surface 202*a* of the carrier 202, the first layer 204 including at least one metal and carbon; in 820, forming a second layer 206 over the first layer 204, the second layer 206 including a diffusion barrier material, wherein the solubility of carbon in the diffusion barrier material is less than in the at least one metal; wherein the at least one metal of the first layer and the diffusion bather material are selected so that an alloy can be formed from the at least one metal of the first layer 204 and from the diffusion barrier material 206; in 830, forming a graphene 208 layer at the surface 202*a* of the carrier 202 from the first layer 204 and forming an alloy layer 412 over the graphene layer 208 from the at least one metal of the first layer 204 and from the diffusion bather material 206 by a temperature treatment; and, in 840, patterning the alloy layer 412 to form a plurality of electrical contacts on the graphene layer (cf. for example FIGS. 4D and 4E).

Figure 9:
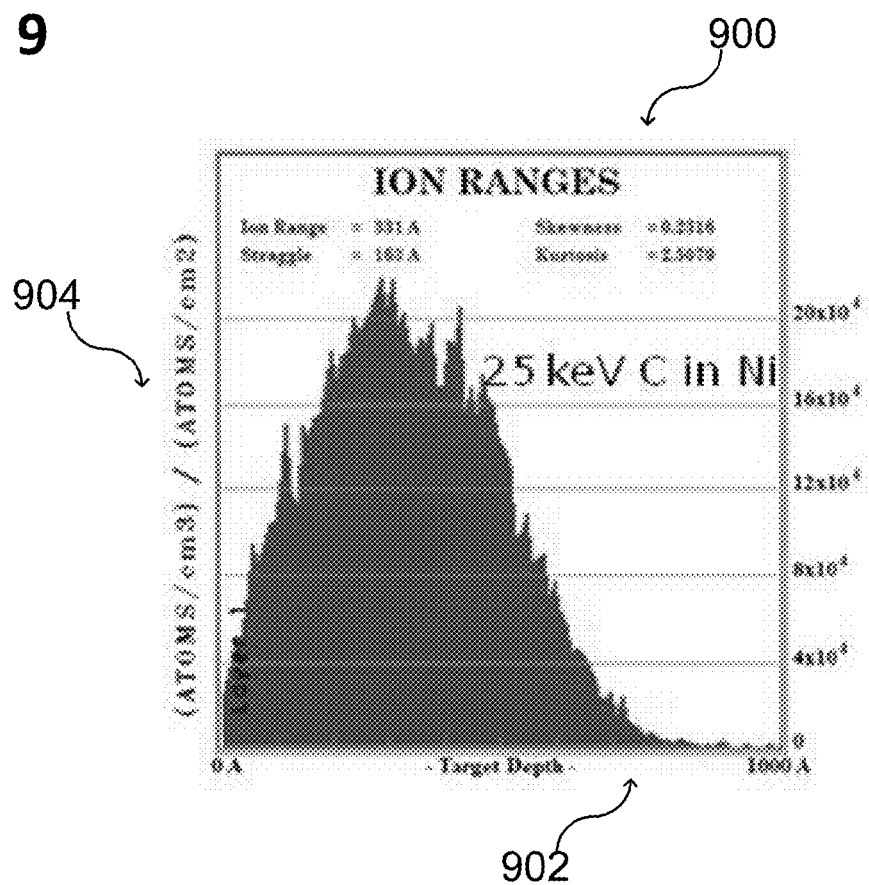
FIG. 9 shows a schematic ion implantation profile in a nickel layer according to various embodiments.

FIG. 9 illustrates an ion implantation profile 900 for carbon ions being implanted into a nickel layer 204. The concentration of implanted carbon ions 904 in dependence of the corresponding implantation depth 902 may be statistically distributed. Ion implantation may be used to introduce carbon into the first layer 204, e.g. into a nickel layer.

According to various embodiments, a method for processing a carrier may include: co-depositing at least one metal from a first source and carbon from a second source over a surface of the carrier to form a first layer, forming a second layer over the first layer, the second layer including a diffusion barrier material, wherein the solubility of carbon in the diffusion bather material is less than in the at least one metal; and subsequently annealing the first layer to form a graphene layer of diffused carbon at the surface of the carrier.

According to various embodiments, a method for processing a carrier may include: co-depositing at least one metal from a first source and carbon from a second source over a surface of the carrier to form a first layer; forming a second layer over the first layer, the second layer including a diffusion barrier material, wherein the solubility of carbon in the diffusion barrier material is less than in the at least one metal; and forming a graphene layer at the surface of the carrier from the carbon of the first layer by a temperature treatment.

Thereby, the second layer may hinder carbon diffusion from the first layer into the second layer or through the second layer.

According to various embodiments, co-depositing the at least one metal may include a first vapor deposition process and co-depositing the carbon may include a second vapor deposition process, wherein the first vapor deposition process and the second vapor deposition process are performed at least one of simultaneously or alternately. Illustratively, alternately performing the first vapor deposition process and the second vapor deposition process may include forming a plurality of sub layers including the at least one metal and a plurality of sub layers including carbon.

According to various embodiments, a graphene layer may also include hydrogenated graphene.

According to various embodiments, the second vapor deposition process may be configured to provide a pre-defined quantity of carbon in the first layer. Further, the pre-defined quantity of carbon in the first layer may be greater than a solubility of carbon in the at least one metal of the first layer. Further, the solubility of carbon may refer to (e.g. may be determined or measured at) a temperature of 20° C., 30° C., 50° C., 100° C. Illustratively, the first layer may include a mixture of the at least one metal and the carbon. Further, the first layer may include a solid solution of the at least one metal and the carbon.

According to various embodiments, the second vapor deposition process may be configured to provide a carbon dose in the first layer which is greater than about $10^{15}$ at/cm². A carbon dose of about $10^{15}$ at/cm² may be required in the first layer for the formation of a graphene monolayer during the temperature treatment. Further, the first layer may have a thickness less than about 100 nm. The quantity of carbon in the first layer may be as required for the formation of a graphene monolayer. The quantity of carbon in the first layer may be an integer multiple of the required quantity of carbon for the formation of a graphene monolayer.

According to various embodiments, forming the second layer may include a third vapor deposition process, wherein the third vapor deposition process may be configured to provide a carbon dose in the second layer which is less than about $10^{15}$ at/cm². The quantity of carbon in the third layer may be less than required for the formation of a graphene monolayer; therefore, no graphene may be formed on top of the third layer or at the interface between the second layer and the third layer.

According to various embodiments, a thickness of the second layer may be greater than a thickness of the first layer.

According to various embodiments, the carbon content in the first layer may be in the range from about 0.1% to about 50%. The carbon content or the quantity of carbon may refer to the atomic percent or mole percent.

According to various embodiments, the method for processing the carrier may further include: forming a third layer over the second layer before the temperature treatment, the third layer including at least one metal.

According to various embodiments, a thickness of the third layer may be greater than a thickness of the first layer. According to various embodiments, a thickness of the third layer may be greater than a thickness of the second layer.

According to various embodiments, the method for processing the carrier may further include: patterning the carrier before forming the first layer.

According to various embodiments, the temperature treatment may be performed in the presence of hydrogen.

According to various embodiments, the method for processing the carrier may further include: performing a patterning before the temperature treatment to partially expose the surface of the carrier.

According to various embodiments, the method for processing the carrier may further include: performing a patterning after the temperature treatment to partially expose the graphene layer. Further, the method for processing the carrier may include removing exposed portions of the graphene layer According to various embodiments, the method for processing a carrier may further include: performing a patterning after the temperature treatment to partially expose the surface of the carrier.

According to various embodiments, the at least one metal of the first layer and the diffusion barrier material may be selected so that an alloy can be formed during the temperature treatment from the at least one metal of the first layer and the diffusion barrier material.

According to various embodiments, the at least one metal of the first layer, the at least one metal of the third layer, and the diffusion barrier material are selected so that an alloy can be formed during the temperature treatment from the at least one metal of the first layer, the at least one metal of the third layer, and the diffusion barrier material.

According to various embodiments, a method for processing a carrier may include: forming a first layer over a surface of the carrier, the first layer including at least one metal and carbon; forming a second layer over the first layer, the second layer including a diffusion barrier material, wherein the solubility of carbon in the diffusion barrier material is less than in the at least one metal of the first layer; forming a third layer over the second layer, the third layer including at least one metal, wherein the at least one metal of the first layer, the at least one metal of the third layer, and the diffusion barrier material are selected so that an alloy can be formed from the at least one metal of the first layer, from the at least one metal of the third layer, and from the diffusion barrier material; and forming a graphene layer at the surface of the carrier from the carbon of the first layer and forming an alloy layer over the graphene layer from the at least one metal of the first layer, from the at least one metal of the third layer, and from the diffusion barrier material by a temperature treatment.

According to various embodiments, forming the first layer may include co-depositing the at least one metal from a first source and the carbon from a second source.

According to various embodiments, a method for processing a carrier may include: forming a first layer over a surface of the carrier, the first layer including at least one metal and carbon; forming a second layer over the first layer, the second layer including a diffusion barrier material, wherein the solubility of carbon in the diffusion barrier material is less than in the at least one metal; wherein the at least one metal of the first layer and the diffusion barrier material are selected so that an alloy can be formed from the at least one metal of the first layer and from the diffusion barrier material; forming a graphene layer at the surface of the carrier from the carbon of the first layer and forming an alloy layer over the graphene layer from the at least one metal of the first layer and from the diffusion barrier material by a temperature treatment; and patterning the alloy layer to form a plurality of electrical contacts on the graphene layer.

According to various embodiments, forming the first layer may include co-depositing the at least one metal from a first source and the carbon from a second source.

According to various embodiments, the temperature treatment may be performed so that an evaporation of the at least one metal of the first layer and/or the at least one metal of the third layer, and/or the diffusion barrier material of the second layer may be substantially avoided. Therefore, the temperature control may be accurately calibrated, so that for example the temperature during the temperature treatment may not exceed 1020° C. if copper is included in the first layer, in the third layer, and/or in the second layer.

According to various embodiments, a method for processing a carrier may include: co-depositing at least one metal from a first source and carbon from a second source over a surface of the carrier to form a first layer, forming a second layer over the first layer, the second layer comprising a diffusion barrier material, wherein the solubility of carbon in the diffusion barrier material is less than in the at least one metal; and segregating a graphene layer from the first layer by a temperature treatment, the graphene layer disposed at the surface of the carrier and covered with the remaining material from the first layer and the second layer.

According to various embodiments, co-depositing at least one metal from a first source and carbon from a second source may include at least one sputter deposition process, wherein the first source may be provided by a first sputtering target (also called cathode) and wherein the second source may be provided by a second sputtering target. Alternatively, the first source and the second source may be provided by a single sputtering target, e.g. including the at least one metal in a first target region and the carbon in a second target region.

According to various embodiments, the copper deposited as diffusion barrier layer may include a carbon concentration (in atom percent) in the range from about 0.001 at % to about 0.1 at %, e.g. in the range from about 0.005 at % to about 0.015 at %.

According to various embodiments, a method for processing a carrier may include: depositing a first layer over the carrier, the first layer including at least one metal and carbon, forming a second layer over the first layer, the second layer including a diffusion barrier material, wherein the solubility of carbon in the diffusion barrier material is less than in the at least one metal; and subsequently annealing the first layer to form a graphene layer of diffused carbon at the surface of the carrier. Further, depositing the first layer (or forming the first layer) may include depositing the at least one metal and the carbon from at least one target by sputter deposition.

According to various embodiments, the first layer may be deposited from a mixed sputtering target (cathode) by sputter deposition, the mixed sputtering target may be provided with a predefined carbon concentration in the at least one metal. According to various embodiments, the mixed sputtering target may include a carbon concentration (in atom percent, abbreviated as at %) in the range from about 0.25 at % to about 10 at %, e.g. in the range from about 0.25 at % to about 5 at %.

According to various embodiments, the first source and the second source may be spatially separated from each other. Further, the first source and the second source may be functionally separated from each other, in other words, the first source and the second source may be individually controlled or individually controllable by a control system. According to various embodiments, the first source may be different from the second source.

According to various embodiments, the number of graphene layers formed from the first layer by the heat treatment may be controlled by the quantity of carbon provided in the first layer before the heat treatment is carried out. A residual amount of carbon remaining in the metal or metal alloy over the carbon layer after the heat treatment may be considered as offset for controlling the quantity of carbon to be provided in the first layer to form the desired number of graphene layers (or graphene sheets). In case that the diffusion barrier material of the second layer and the at least one metal of the first layer form an alloy during the heat treatment, the diffusion barrier material may drive out the carbon from the first layer to the substrate interface or may assist the diffusion of the carbon from the first layer to the substrate interface during the heat treatment.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for processing a carrier, the method comprising:
   co-depositing at least one metal from a first source and carbon from a second source over a surface of the carrier to form a first layer;
   forming a second layer over the first layer, the second layer comprising a diffusion barrier material, wherein the solubility of carbon in the diffusion barrier material is less than in the at least one metal; and
   after forming the second layer, forming a graphene layer at the surface of the carrier from the first layer by a temperature treatment.

2. The method of claim 1,
   wherein the second layer hinders carbon diffusion from the first layer into the second layer.

3. The method of claim 1,
   wherein co-depositing the at least one metal comprises a first vapor deposition process; and
   wherein co-depositing the carbon comprises a second vapor deposition process, wherein the first vapor deposition process and the second vapor deposition process are performed at least one of simultaneously or alternately.

4. The method of claim 3,
   wherein the second vapor deposition process is configured to provide a pre-defined quantity of carbon in the first layer.

5. The method of claim 4,
   wherein the pre-defined quantity of carbon in the first layer is greater than a solubility of carbon in the at least one metal of the first layer.

6. The method of claim 5,
   wherein the solubility of carbon in the at least one metal of the first layer refers to a temperature of one or 20° C., 50° C., 100° C.

7. The method of claim 3,
   wherein the second vapor deposition process is configured to provide a carbon dose in the first layer which is greater than $10^{15}$ at/cm$^2$.

8. The method of claim 1,
   wherein forming the second layer comprises a third vapor deposition process, wherein the third vapor deposition process is configured to provide a carbon dose in the second layer which is less than $10^{15}$ at/cm$^2$.

9. The method of claim 1, further comprising: forming a third layer over the second layer before the temperature treatment, the third layer comprising at least one metal.

10. The method of claim 1, further comprising:
    patterning the carrier before forming the first layer.

11. The method of claim 1, further comprising:
    performing a patterning before the temperature treatment to partially expose the surface of the carrier.

12. The method of claim 1, further comprising:
    performing a patterning after the temperature treatment to partially expose the graphene layer.

13. The method of claim 12, further comprising:
    removing exposed portions of the graphene layer after patterning.

14. The method of claim 1,
    wherein the temperature treatment is performed in the presence of hydrogen.

15. The method of claim 1,
    wherein the at least one metal of the first layer and the diffusion barrier material are selected so that an alloy is formed during the temperature treatment from the at least one metal of the first layer and from the diffusion barrier material.

16. The method of claim 9, wherein the at least one metal of the first layer, the at least one metal of the third layer, and the diffusion barrier material are selected so that an alloy is formed during the temperature treatment from the at least one metal of the first layer, from the at least one metal of the third layer, and from the diffusion barrier material.

17. A method for processing a carrier, the method comprising:
forming a first layer over a surface of the carrier, the first layer comprising at least one metal and carbon;
forming a second layer over the first layer, the second layer comprising a diffusion barrier material, wherein a solubility of carbon in the diffusion barrier material is less than in the at least one metal of the first layer;
forming a third layer over the second layer, the third layer comprising at least one metal, wherein the at least one metal of the first layer, the at least one metal of the third layer, and the diffusion barrier material are selected so that an alloy can be formed from the at least one metal of the first layer, from the at least one metal of the third layer, and from the diffusion barrier material; and
after forming the third layer, forming a graphene layer at the surface of the carrier from the first layer and forming an alloy layer over the graphene layer from the at least one metal of the first layer, from the at least one metal of the third layer, and from the diffusion bather material by a temperature treatment.

18. The method of claim 17, wherein forming the first layer comprises co-depositing the at least one metal from a first source and the carbon from a second source.

19. A method for processing a carrier, the method comprising:
forming a first layer over a surface of the carrier, the first layer comprising at least one metal and carbon;
forming a second layer over the first layer, the second layer comprising a diffusion bather material, wherein the solubility of carbon in the diffusion bather material is less than in the at least one metal; wherein the at least one metal of the first layer and the diffusion bather material are selected so that an alloy can be formed from the at least one metal of the first layer and from the diffusion barrier material;
after forming the third layer, forming a graphene layer at the surface of the carrier from the first layer and forming an alloy layer over the graphene layer from the at least one metal of the first layer and from the diffusion bather material by a temperature treatment; and
patterning the alloy layer to form a plurality of electrical contacts on the graphene layer.

20. The method of claim 19, wherein forming the first layer comprises depositing the at least one metal and the carbon from at least one sputtering target by sputter deposition.

* * * * *